United States Patent
Rabkin et al.

(10) Patent No.: US 9,515,085 B2
(45) Date of Patent: Dec. 6, 2016

(54) VERTICAL MEMORY DEVICE WITH BIT LINE AIR GAP

(71) Applicant: SanDisk Technologies, Inc., Plano, TX (US)

(72) Inventors: Peter Rabkin, Cupertino, CA (US); Jilin Xia, Milpitas, CA (US); Jayavel Pachamuthu, San Jose, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 14/498,033

(22) Filed: Sep. 26, 2014

(65) Prior Publication Data

US 2016/0093635 A1    Mar. 31, 2016

(51) Int. Cl.
| | |
|---|---|
| *H01L 27/115* | (2006.01) |
| *H01L 21/02* | (2006.01) |
| *H01L 21/768* | (2006.01) |
| *H01L 23/528* | (2006.01) |

(52) U.S. Cl.
CPC ... *H01L 27/11582* (2013.01); *H01L 21/02381* (2013.01); *H01L 21/7682* (2013.01); *H01L 21/76802* (2013.01); *H01L 21/76877* (2013.01); *H01L 23/528* (2013.01); *H01L 27/1157* (2013.01); *H01L 27/11524* (2013.01); *H01L 27/11556* (2013.01)

(58) Field of Classification Search
CPC ............ H01L 27/11582; H01L 27/1157; H01L 27/11556; H01L 2924/0002; H01L 27/11578; H01L 27/11524; H01L 21/28282
USPC ........................................................ 257/315
See application file for complete search history.

(56) References Cited

U.S. PATENT DOCUMENTS

| | | |
|---|---|---|
| 5,915,167 A | 6/1999 | Leedy |
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |

(Continued)

FOREIGN PATENT DOCUMENTS

WO    WO02/15277 A1    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Rapers, pp. 192-193.

(Continued)

*Primary Examiner* — Tony Tran
(74) *Attorney, Agent, or Firm* — The Marbury Law Group PLLC

(57) ABSTRACT

A structure includes a three-dimensional semiconductor device including a plurality of unit device structures located over a substrate. Each of the unit device structures includes a semiconductor channel including at least a portion extending vertically along a direction perpendicular to a top surface of the substrate, and a drain region contacting a top end of the semiconductor channel. The structure also includes a combination of a plurality of contact pillars and a contiguous volume that laterally surrounds the plurality of contact pillars. The plurality of contact pillars is in contact with the drain regions, and the contiguous volume has a dielectric constant less than 3.9.

6 Claims, 13 Drawing Sheets

(56) References Cited

U.S. PATENT DOCUMENTS

| | | | |
|---|---|---|---|
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,349,681 | B2 | 1/2013 | Alsmeier et al. |
| 8,658,499 | B2 | 2/2014 | Makala et al. |
| 2007/0210338 | A1 | 9/2007 | Orlowski |
| 2007/0252201 | A1 | 11/2007 | Kito et al. |
| 2009/0108333 | A1 | 4/2009 | Kito et al. |
| 2009/0242967 | A1 | 10/2009 | Katsumata et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0198687 | A1 | 8/2011 | Lee |
| 2011/0248327 | A1* | 10/2011 | Son .................. H01L 27/11551 257/315 |
| 2011/0266606 | A1 | 11/2011 | Park et al. |
| 2011/0280077 | A1 | 11/2011 | Fishburn |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0092926 | A1 | 4/2012 | Whang |
| 2012/0146122 | A1* | 6/2012 | Whang ............... H01L 29/7889 257/315 |
| 2013/0264631 | A1 | 10/2013 | Alsmeier et al. |
| 2013/0313627 | A1 | 11/2013 | Lee et al. |
| 2014/0138760 | A1 | 5/2014 | Makala et al. |
| 2014/0273373 | A1 | 9/2014 | Makala et al. |
| 2014/0284693 | A1* | 9/2014 | Sato ................. H01L 29/66833 257/324 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) pp. 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M., "3D Cells Make Terabit NAND Flash Possible," Nikkei Electronics Asia, Sep. 17, 2009, 6pgs.

International Search Report and Written Opinion, International Application No. PCT/US2011/042566, issued Jan. 17, 2012.

Invitation to Pay Additional Fees & Partial International Search Report, PCT/US2011/042566, issued Sep. 28, 2011.

Chen et al., "Reliability Characteristics of NiSi Nanocrystals Embedded in Oxide and Nitride Layers for Nonvolatile Memory Application," Applied Physics Letters, 92, 152114 (2008).

Invitation to Pay Additional Search Fees, International Application No. PCT/2013/048508, issued Sep. 18, 2013.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

International Search Report and Written Opinion, International Application No. PCT/US2013/048508, issued Dec. 18, 2013.

Chen et al., "Formation of $NiSi_2/SiN_x$ Compound Nanocrystal for Nonvolatile Memory Application," Thin Solid Films, Elsevier-Sequoia S.A., Lausanne, Switzerland, vol. 518, No. 24, pp. 7324-7327 (2010).

Diaz, "Low-$k$ Dielectrics: Materials and Process Technology," EE518, Penn State University, Apr. 13, 2006.

Saraswat, "Low-k Dieletrics," Department of Electrical Engineering, Stanford University, Jul. 2008.

Rabkin, P. et al., "Three Dimensional Nand Devices with Air Gap or Low-K Core," U.S. Appl. No. 14/326,298, filed Jul. 8, 2014.

Endoh, et al., "Novel Ultra High Density Memory with a Stacked-Surrounding Gate Transistor (S-SGT) Structured Cell," IEDM Proc. (2001) 33-36.

International Search Report and Written Opinion for PCT/US2015/0049597, dated Apr. 8, 2016, 17 pages.

* cited by examiner

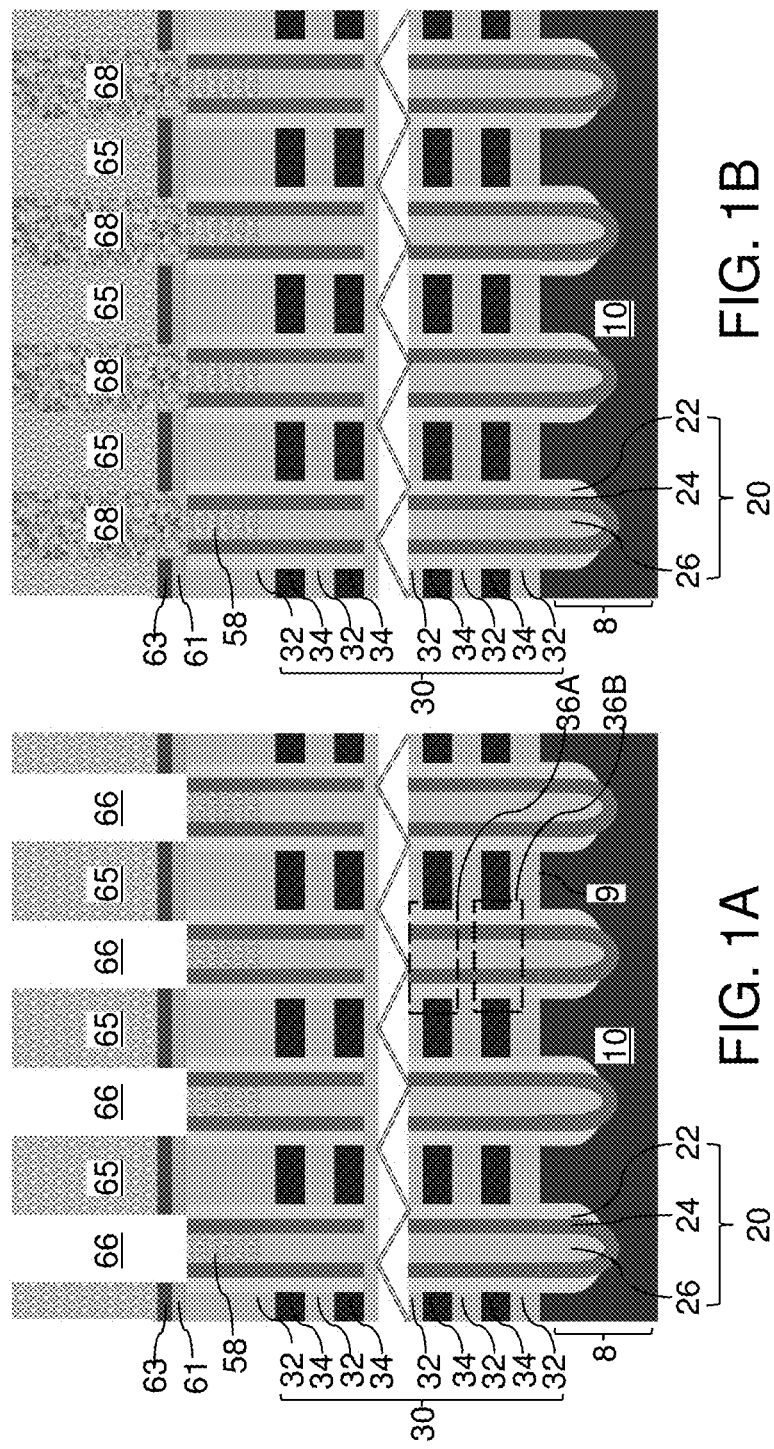

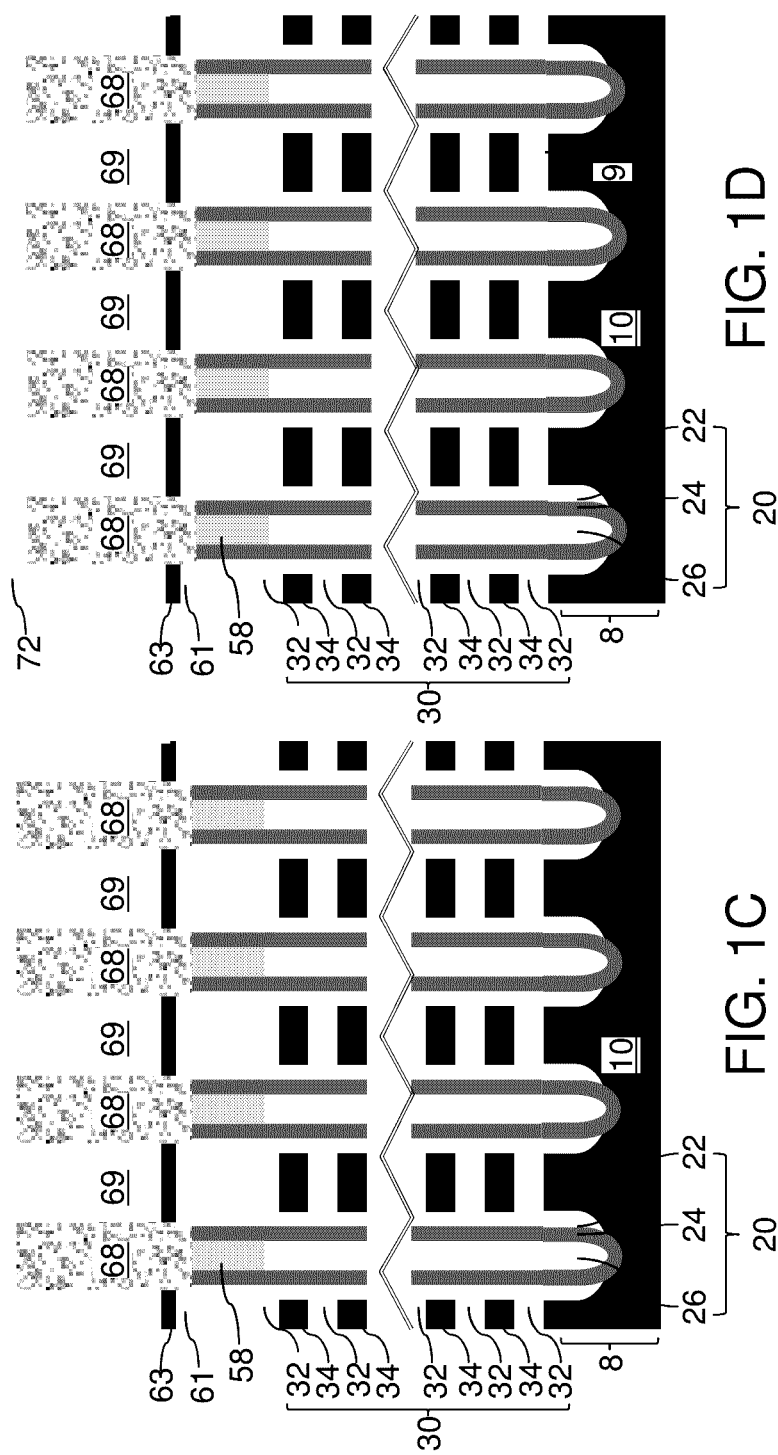

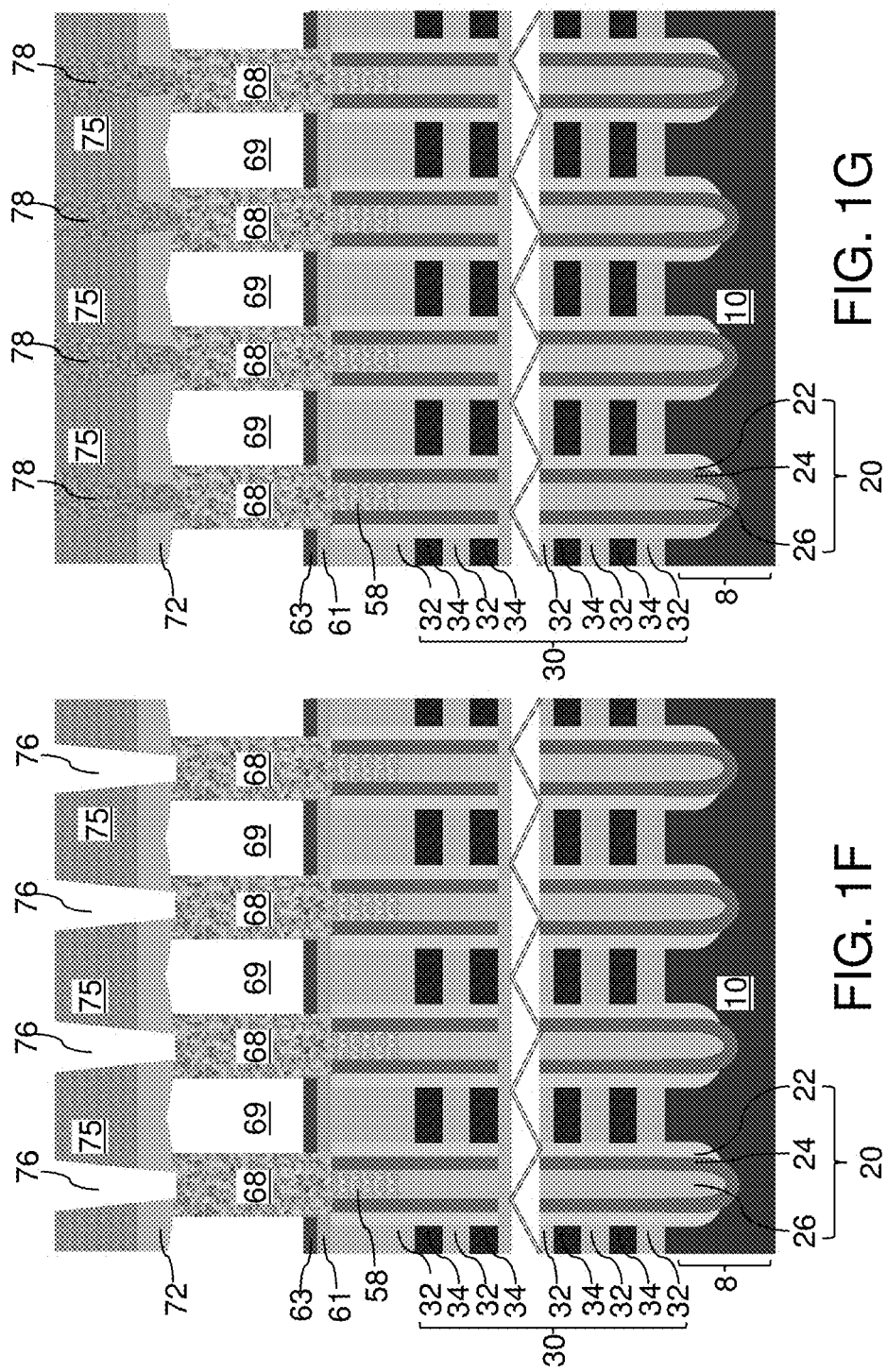

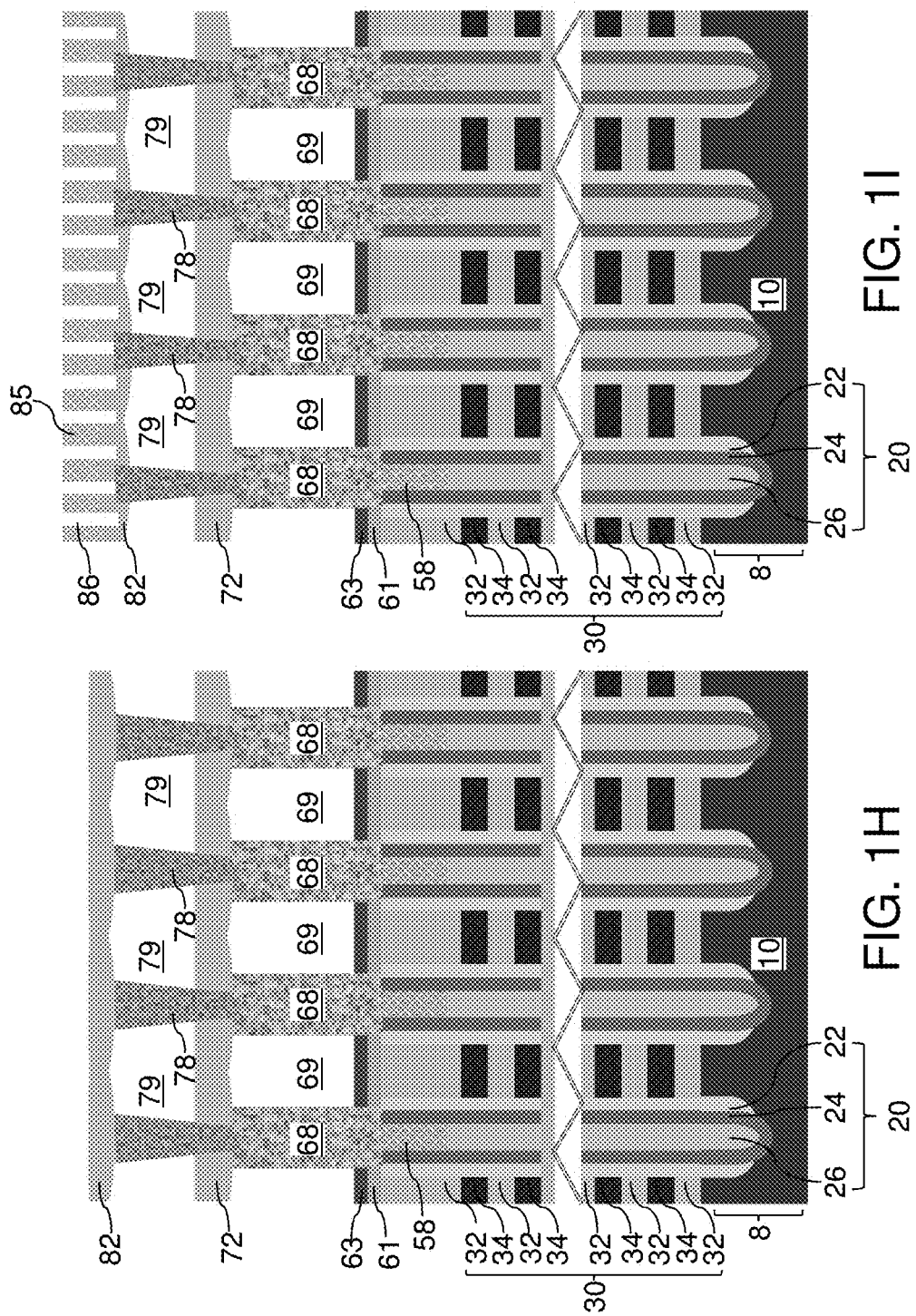

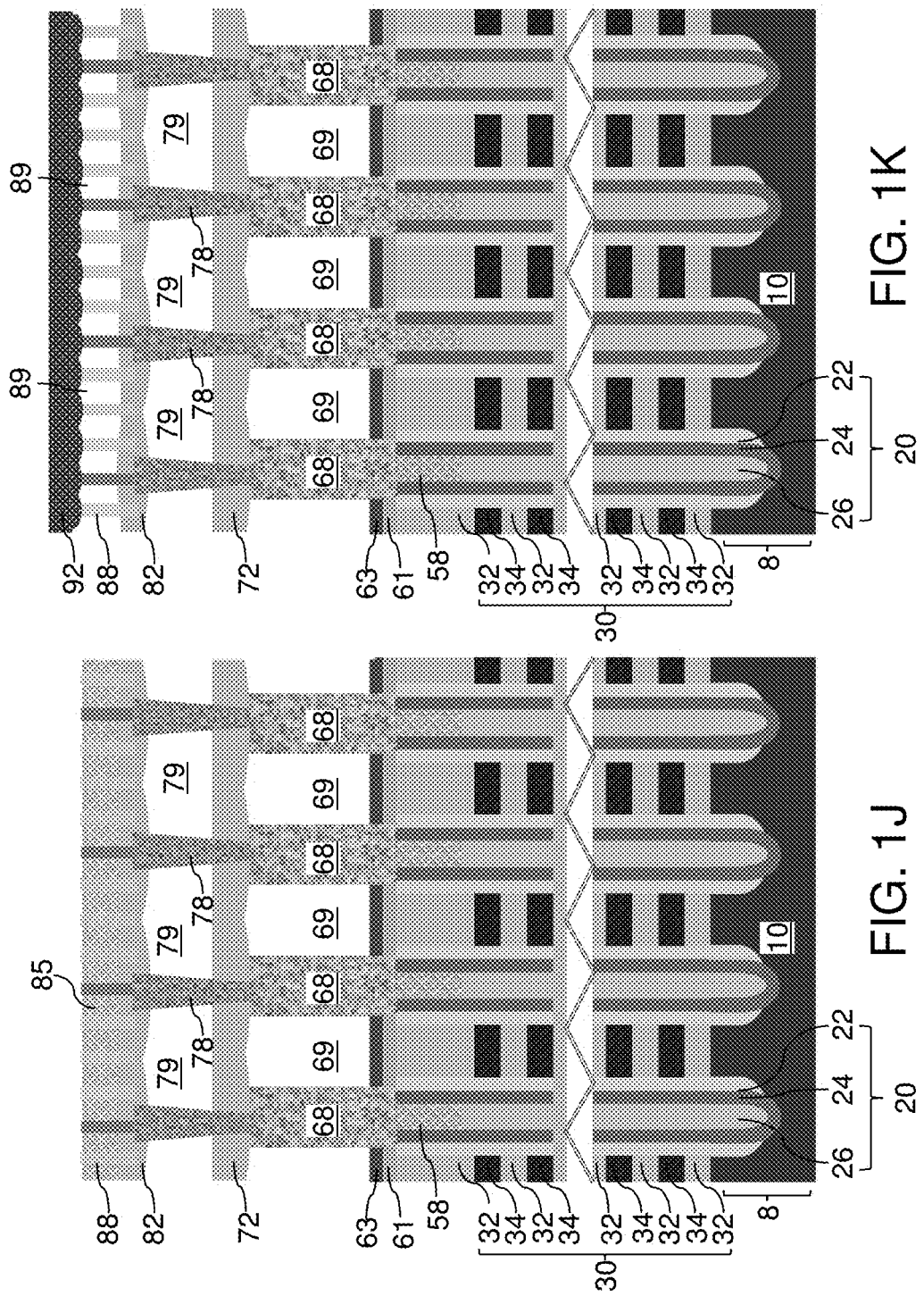

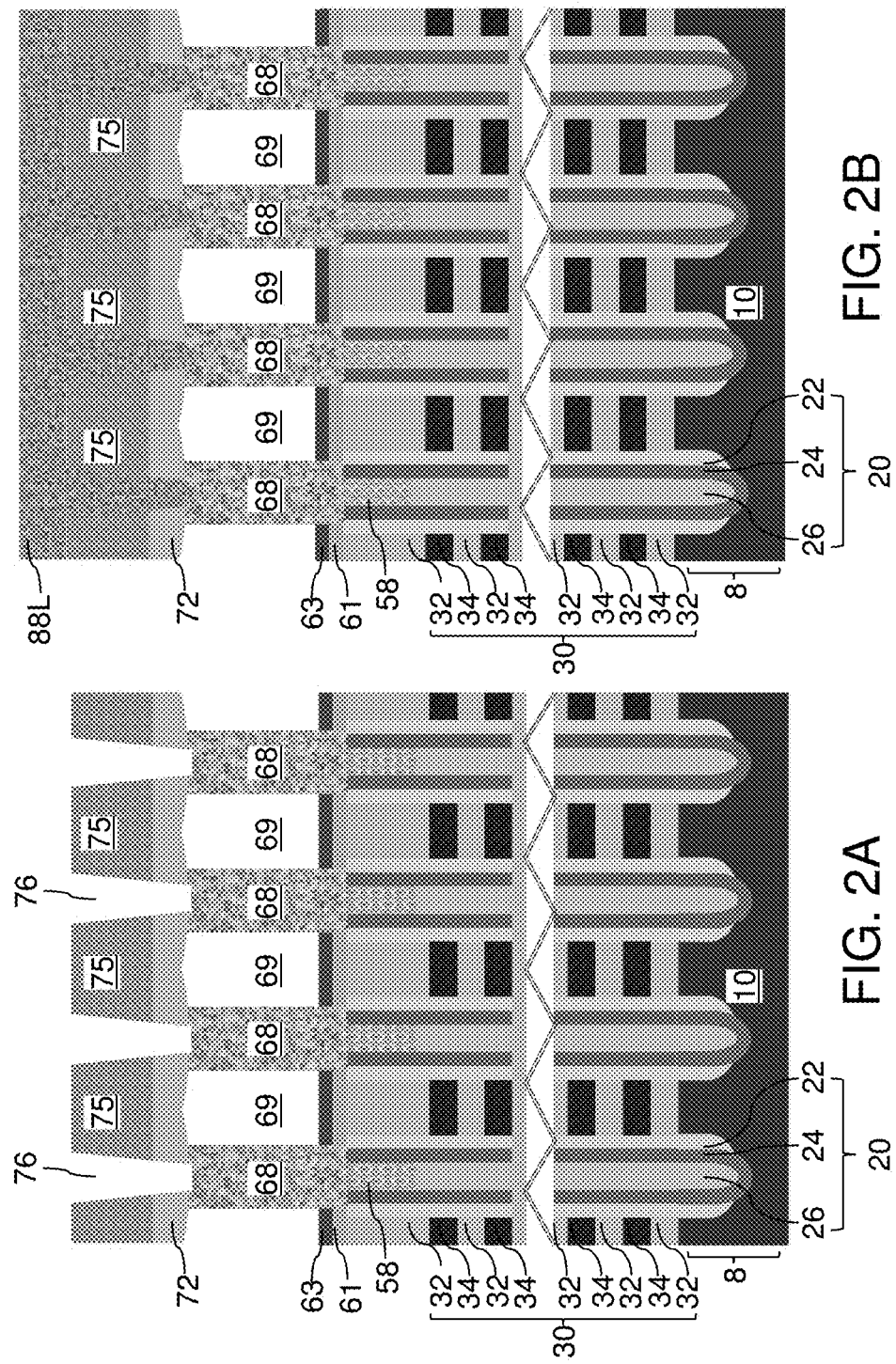

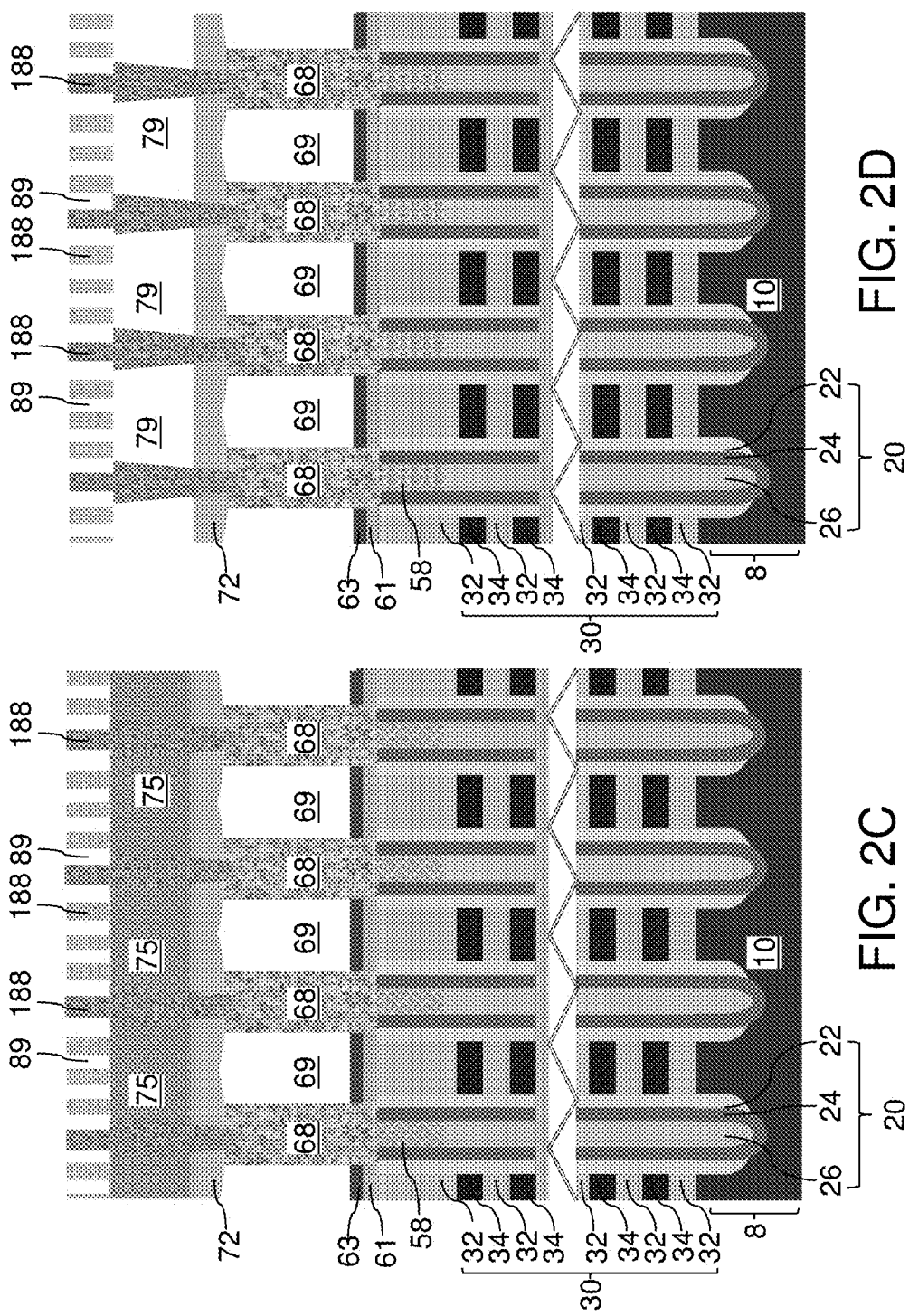

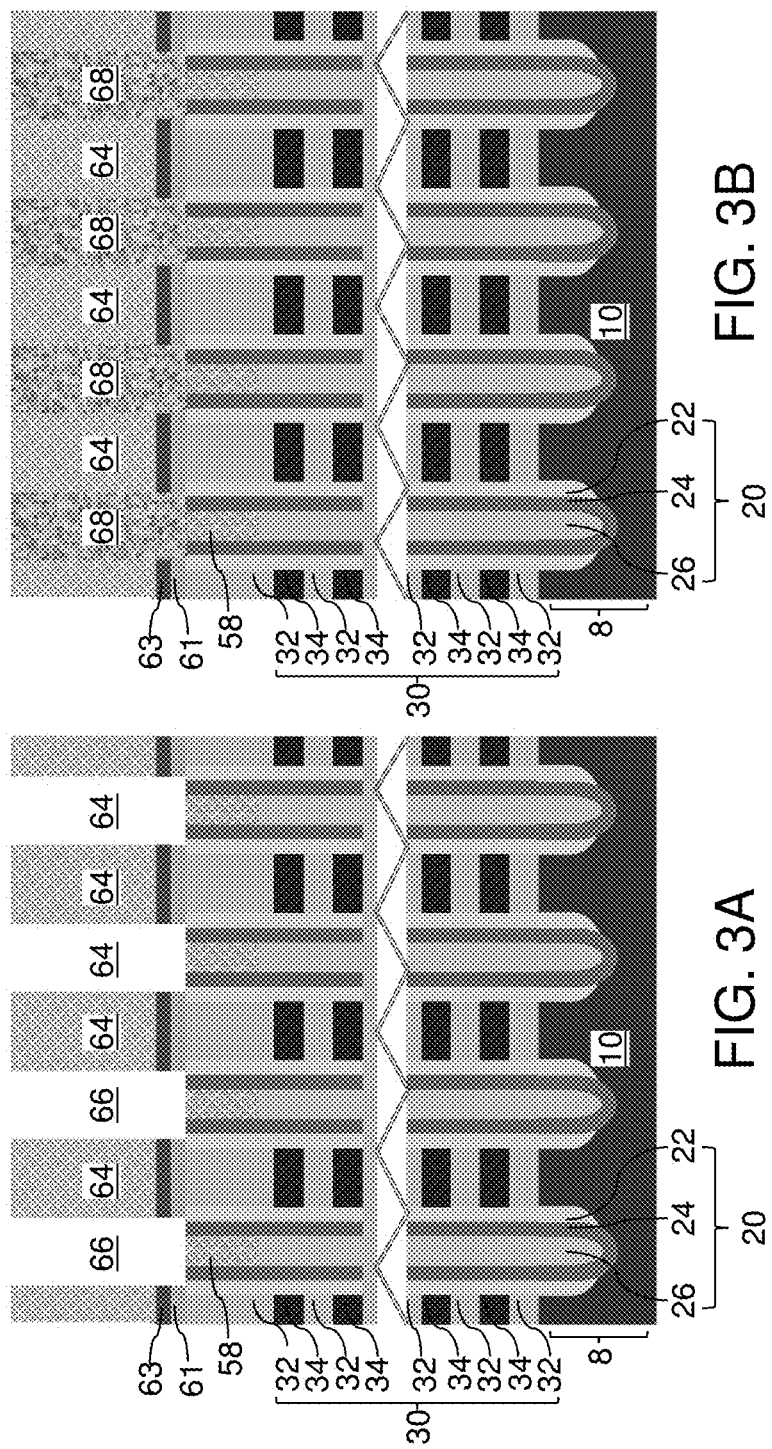

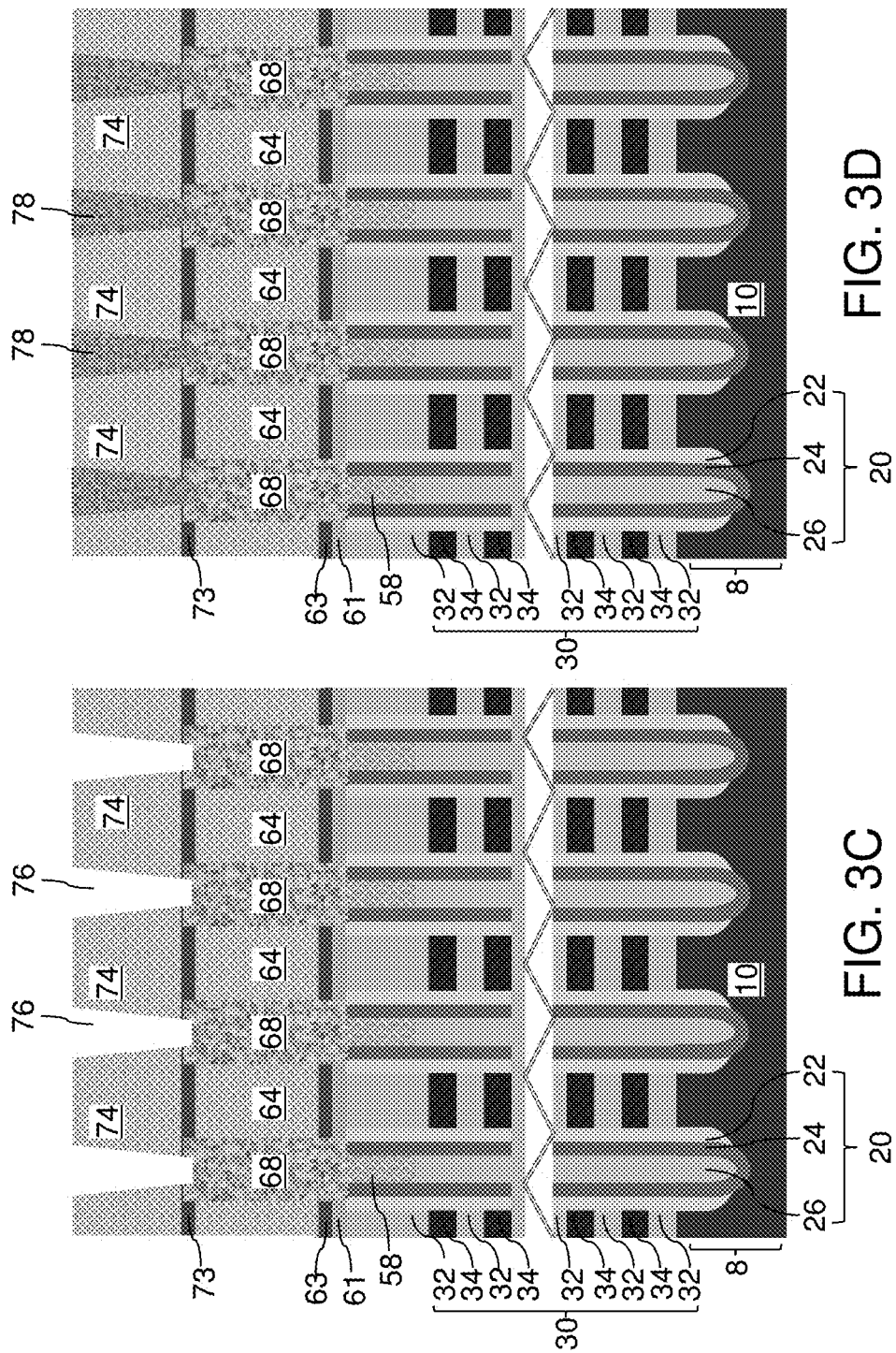

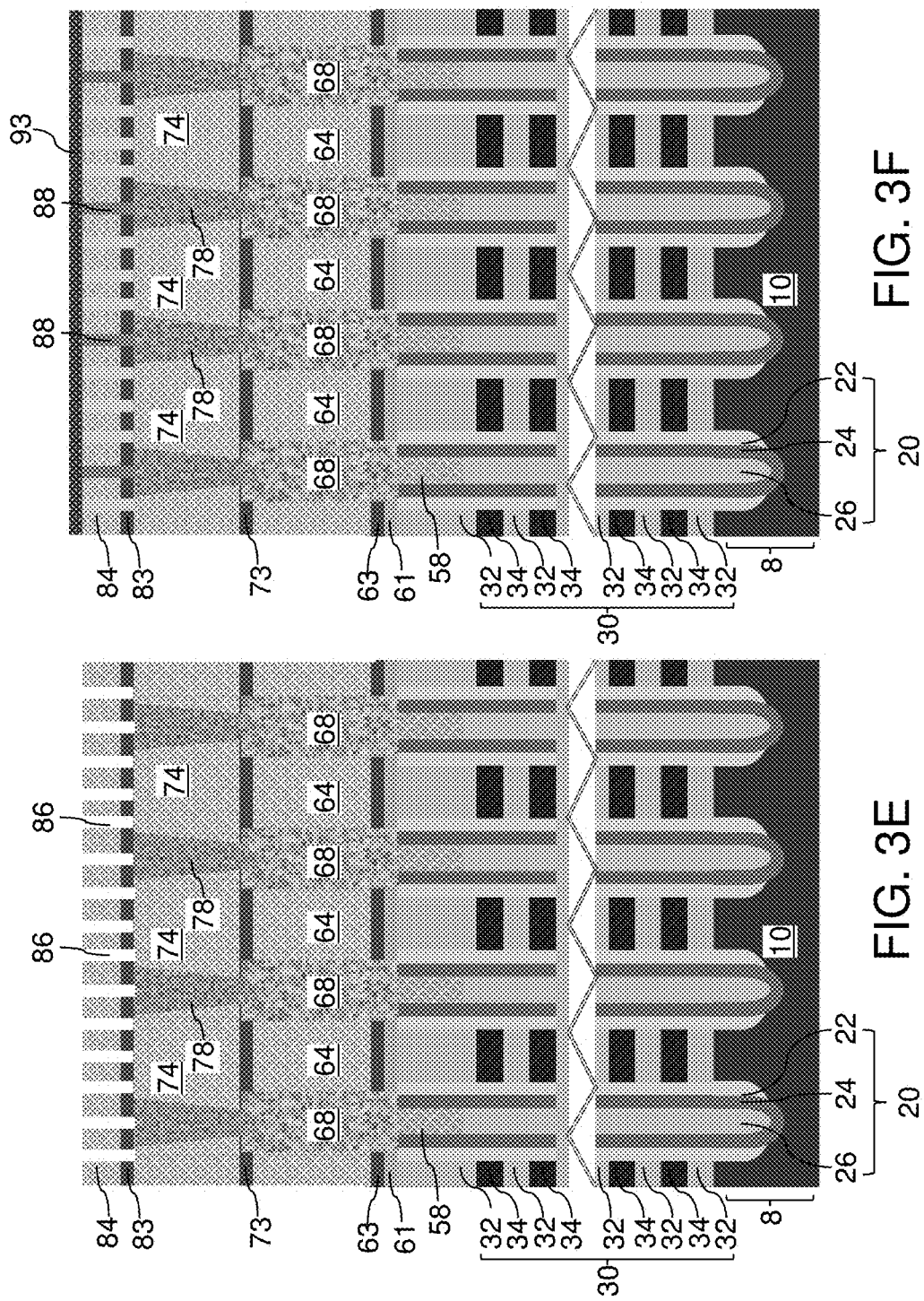

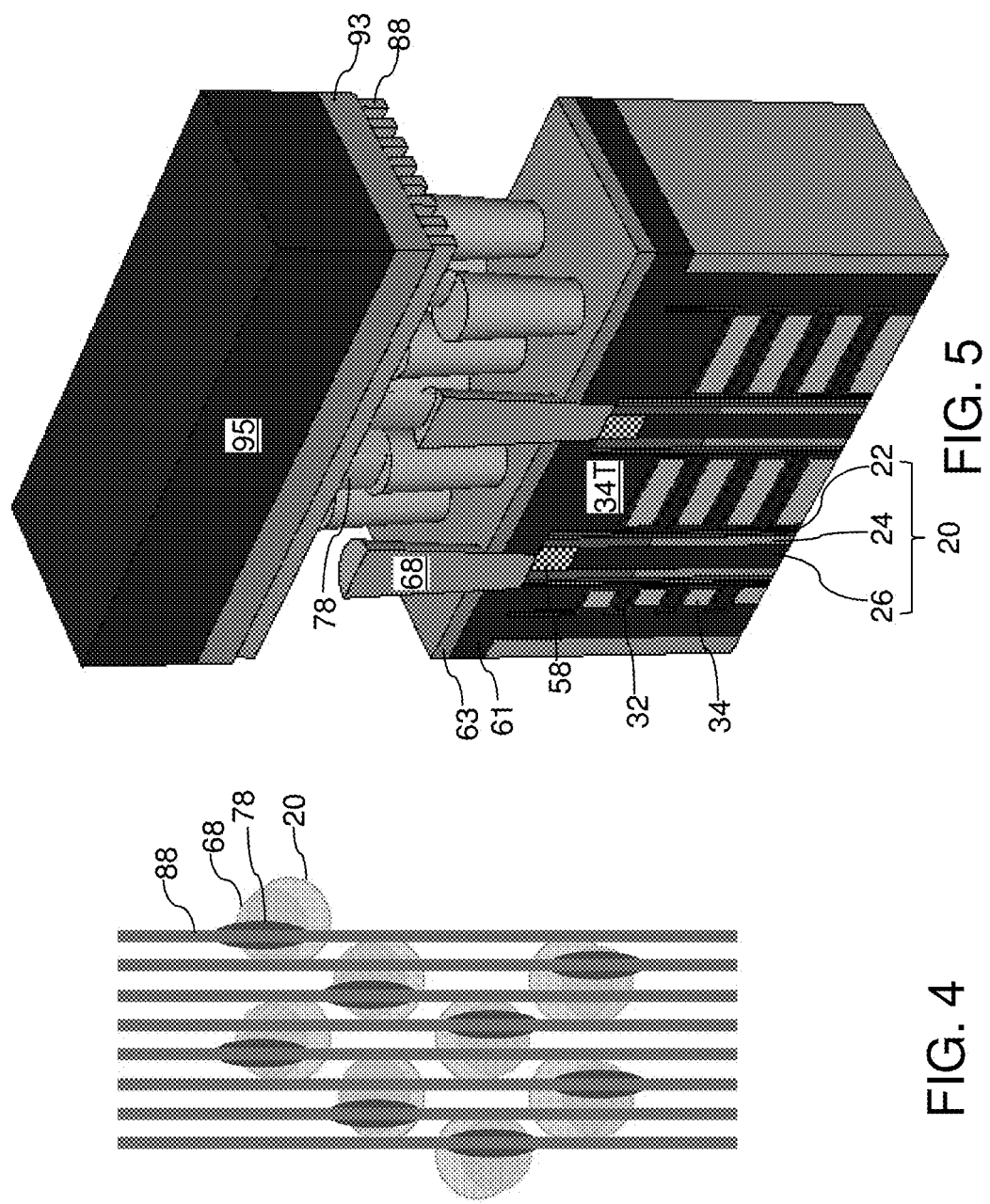

VERTICAL MEMORY DEVICE WITH BIT LINE AIR GAP

FIELD

The present disclosure relates to the field of semiconductor devices, and specifically to three-dimensional semiconductor devices, such as vertical NAND strings and other three-dimensional devices, and methods of making the same.

BACKGROUND

Recently, ultra high density storage devices have been proposed using a three-dimensional (3D) stacked memory structure sometimes referred to as a Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

SUMMARY

According to an aspect of the present disclosure, a method of fabricating a memory device is provided. A three-dimensional semiconductor device including a plurality of unit device structures is formed over a substrate. Each of the unit device structures includes a semiconductor channel having at least a portion extending vertically along a direction perpendicular to a top surface of the substrate, and a drain region contacting a top end of the semiconductor channel. A combination of a plurality of contact pillars and a contiguous volume of a homogeneous composition that laterally surrounds the plurality of contact pillars is formed. The each of plurality of contact pillars is in contact with a respective one of the drain regions. The contiguous volume has a dielectric constant less than 3.9.

According to another aspect of the present disclosure, a three-dimensional semiconductor device is provided, which includes a plurality of unit device structures located over a substrate. Each of the unit device structures includes a semiconductor channel including at least a portion extending vertically along a direction perpendicular to a top surface of the substrate, and a drain region contacting a top end of the semiconductor channel. The structure further includes comprising combination of a plurality of contact pillars and a contiguous volume of a homogeneous composition that laterally surrounds the plurality of contact pillars. Each of the plurality of contact pillars is in contact with a respective one of the drain regions. The contiguous volume has a dielectric constant less than 3.9.

According to still another aspect of the present disclosure, a monolithic three dimensional NAND string is provided, which includes a plurality of semiconductor channels. At least one end portion of each semiconductor channel extends substantially perpendicular to a top surface of a substrate. The monolithic three dimensional NAND string further includes a plurality of drain regions. Each drain region contacts a top end of a respective one of the plurality of semiconductor channels. A plurality of control gate electrodes extends substantially parallel to a top surface of a substrate. The plurality of control gate electrodes comprises at least a first control gate electrode located in a first device level and a second control gate electrode located in a second device level located over the major surface of the substrate and below the first device level. A plurality of interlevel insulator layers is located between the plurality of control gate electrodes, such that a first interlevel insulator layer is located between the first control gate electrode and the second control gate electrode. A blocking dielectric is located in contact with the plurality of control gate electrodes. At least one charge storage region is located in contact with the blocking dielectric. A tunnel dielectric is located between the at least one charge storage region and the semiconductor channel. A plurality of bit lines and a plurality of electrical contacts are provided. Each electrical contact electrically connects a respective one of the plurality of drain regions with a respective one of the plurality of bit lines. A cavity or a low-k dielectric layer having a dielectric constant below 3.9 is located among the plurality of electrical contacts.

BRIEF DESCRIPTION OF THE DRAWINGS

FIGS. 1A-1D and 1F-1K are sequential vertical cross-sectional views of a first exemplary structure containing a NAND string at various steps for forming an overlying metal interconnect structure according to a first embodiment of the present disclosure.

FIGS. 2A-2E are sequential vertical cross-sectional views of a second exemplary structure containing a NAND string at various steps for forming an overlying metal interconnect structure according to a second embodiment of the present disclosure.

FIGS. 3A-3F are sequential vertical cross-sectional views of a third exemplary structure containing a NAND string at various steps for forming an overlying metal interconnect structure according to a third embodiment of the present disclosure.

FIG. 4 is a see-through top-down view of a region of an exemplary structure, which can be any of the first, second, and third exemplary structure, according to an embodiment of the present disclosure.

FIG. 5 is a bird's eye view of a cut-out portion of an exemplary structure, which can be any of the first, second, and third exemplary structures, according to an embodiment of the present disclosure.

DETAILED DESCRIPTION

Figure 1E:
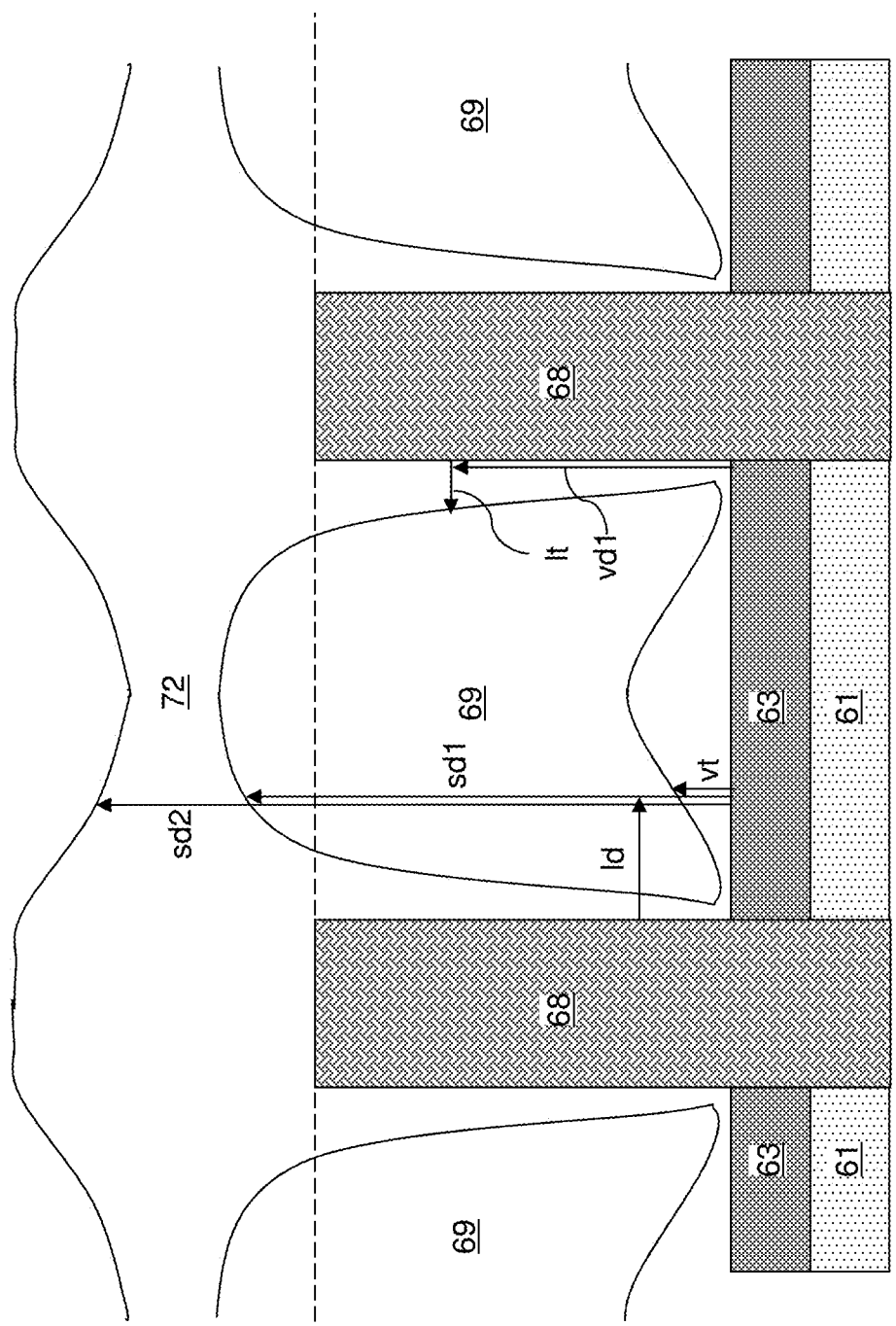
FIG. 1E is a magnified vertical cross-sectional view of a region of the first exemplary structure of FIG. 1D.

As discussed above, the present disclosure is directed to three-dimensional semiconductor devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

The drain regions of the memory cells are connected to bit lines through contact via structures. The present inventors realized that capacitive coupling between the bit lines and the contact via structures contributes to the total parasitic capacitance of the bit lines. The greater the capacitive coupling between the bit lines and the contact via structures to the drain regions, the greater the parasitic capacitance of the bit lines and the RC delay of the bit lines. Further, the present inventors realized that the parasitic capacitance can be reduced by forming a low dielectric constant dielectric materials, a vacuum cavity, or an air cavity over the contact via structures.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various three dimensional memory devices of the present disclosure include a monolithic three-dimensional NAND string memory device, and can be fabricated employing the various embodiments described herein. Referring to FIG. 1A, a first exemplary structure according to a first embodiment of the present disclosure includes a first exemplary structure, which includes a three-dimensional semiconductor device. Specifically, the three-dimensional semiconductor device can contain a monolithic, three-dimensional array of NAND strings that includes a monolithic three-dimensional NAND string located over a substrate 8.

The substrate 8 can include a substrate semiconductor layer 10. In one embodiment, the substrate 8 can be a silicon substrate. Optionally, additional material layers (not shown) may be present underneath the substrate 8. The substrate 8 can be a bulk semiconductor substrate, in which case the entirety of the substrate 8 is a semiconductor substrate. Alternatively, the substrate 8 can be a top semiconductor layer of a semiconductor-on-insulator (SOI) substrate or a top semiconductor material portion a hybrid substrate including at least one bulk semiconductor region and at least one SOI region. In this case, the substrate semiconductor layer 10 can be the top semiconductor layer of an SOI substrate, a semiconductor material layer in a bulk portion, or a top semiconductor portion of in an SOI region of a hybrid substrate.

The substrate semiconductor layer 10 is a semiconductor material layer, and can include at least one elemental semiconductor material (such as silicon), at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface.

As used herein, a "semiconductor material" refers to a material having a resistivity in the range from $1.0\times10^{-5}$ Ohm-cm to $1.0\times10^{5}$ Ohm-cm, and is capable of producing a doped material having a resistivity in a range from $1.0\times10^{-5}$ Ohm-cm to 1.0 Ohm-cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "major surface" refers to a planar surface having a greater area than at least another surface that may be another planar surface or a curved surface. As used herein, a planar surface is a surface that is contained within a Euclidean two-dimensional plane or deviating from a Euclidean two-dimensional plane only by variations caused by surface bowing and/or surface roughness of a magnitude inherently present in commercially available semiconductor substrates.

The substrate semiconductor layer 10 can include a single crystalline semiconductor material, a polycrystalline semiconductor material, and/or an amorphous semiconductor material. In one embodiment, the substrate semiconductor layer 10 can be a single crystalline semiconductor material layer. In one embodiment, the substrate semiconductor layer 10 can include a single crystalline silicon layer, a single crystalline silicon-germanium alloy layer, or a single crystalline silicon-carbon alloy layer. Alternately or additionally, the substrate semiconductor layer 10 can include a polycrystalline silicon layer, a polycrystalline silicon-germanium alloy layer, or a polycrystalline silicon-carbon alloy layer. Portions of the substrate semiconductor layer 10 can be suitably doped with p-type dopants or n-type dopants.

Source regions or drain regions can be formed as doped portions of the substrate semiconductor layer 10, i.e., by doping portions of the substrate semiconductor layer 10 with p-type dopants or n-type dopants. In one embodiment, the doped regions can be formed as source regions for monolithic three-dimensional NAND string memory devices. Each memory string 20 includes memory cells embedded within an alternating stack 30 of insulator layers 32 and conductive electrodes 34, which can be control gate electrodes for the monolithic three-dimensional NAND string memory devices.

Optionally, select gate electrodes such as source-side select gate electrodes (not shown) can be formed within, or on top of, the substrate semiconductor layer 10 employing any suitable material. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

The alternating stack 30 includes alternately stacked insulator layers 32 and conductive electrodes 34. The insulator layers 32 include a first material, which is an electrically insulating material (e.g., interlevel insulating material). The conductive electrodes 34 include a second material, which is a conductive material. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides, dielectric metal oxynitrides, low dielectric constant dielectric materials such as organosilicate glass, dielectric oxides (e.g., aluminum oxide, hafnium oxide, etc.) and silicates thereof, and organic insulating materials. Conductive materials that can be employed for the conductive electrodes 34 include, but are not limited to, a doped semiconductor material, elemental metals, intermetallic alloys, conductive nitrides of at least one elemental metal, a silicate of at least one metal, conductive carbon allotropes, organic conductive materials, and combinations thereof. For example, the second material of the conductive electrodes 34 can be doped polysilicon, tungsten, tungsten nitride, tantalum, tantalum nitride, titanium, titanium nitride, cobalt, copper, aluminum, an alloy thereof, or a combination thereof.

In one embodiment, the insulator layers 32 can include silicon oxide or organosilicate glass, and the conductive electrodes 34 can include doped polysilicon or doped amorphous silicon that can be subsequently converted into doped polysilicon through a thermal anneal at an elevated temperature. The first material of the insulator layers 32 can be deposited, for example, by chemical vapor deposition (CVD). For example, if undoped silicate glass or doped silicate glass is employed for the insulator layers 32, tetraethyl orthosilicate (TEOS) can be employed as the precursor material for the CVD process. The second material of the conductive electrodes 34 can be deposited, for example, by physical vapor deposition (PVD; sputtering), chemical vapor deposition, electroplating, electroless plating, or combinations thereof. Alternatively, the second material of the conductive electrodes 34 can be deposited by formation of an alternating stack of the insulator layers 32 and sacrificial material layers (e.g., silicon nitride layers or polysilicon layers), selective removal of the sacrificial material layer with respect to the insulator layers 32 to form lateral recesses, and deposition of a conductive material within the recesses, for example, by chemical vapor deposition. As used herein, "selective removal" of a first material with respect to a second material refers to removal of the first material selective to the second material. As used herein, removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The conductive electrodes 34 can be suitably patterned to function as the control gate electrodes of the monolithic three-dimensional NAND string memory devices to be subsequently formed. The conductive electrodes 34 may comprise a portion having a strip shape extending substantially parallel to the major surface 9 of the substrate 8.

The thicknesses of the insulator layers 32 and the conductive electrodes 34 can be in a range from 15 nm to 100 nm, although lesser and greater thicknesses can be employed for each insulator layer 32 and for each conductive electrode 34. The topmost layer among the insulator layers 32 may have a greater thickness than underlying insulator layers 32. The number of repetitions of the pairs of an insulator layer 32 and a conductive electrode 34 can be in a range from 2 to 1,024, and typically from 8 to 256, although a greater number of repetitions can also be employed.

An array of memory openings can be formed through the alternating stack 30 by a combination of lithographic methods and at least one anisotropic etch. For example, a photoresist layer (not shown) can be formed over the alternating stack 30 and lithographically patterned to form a plurality of openings therein by lithographic exposure and development. The pattern in the photoresist layer can be transferred through the alternating stack 30 and optionally into an upper portion of the substrate semiconductor layer 10 by at least one anisotropic etch to form an array of memory opening, i.e., openings that are subsequently employed to form an array of memory elements. The chemistry of the anisotropic etch process employed to etch through the materials of the alternating stack 30 can alternate to optimize etching of the first and second materials in the alternating stack 30. The anisotropic etch can be, for example, a series of reactive ion etches. Optionally, a sacrificial etch stop layer (not shown) may be employed between the alternating stack 30 and the substrate 8. The sidewalls of the memory openings can be substantially vertical, or can be tapered.

In one embodiment, an overetch into the substrate semiconductor layer 10 can be optionally performed after the top surfaces of the substrate semiconductor layer 10 are physically exposed. The overetch can form recesses underneath the memory holes from a horizontal plane including the major surface 9 of the substrate 8, i.e., from the top surface of the substrate semiconductor layer 10. The recess depth can be, for example, in a range from 1 nm to 50 nm, although lesser and greater recess depths can also be employed. The overetch is optional, and may be omitted.

Each of the memory openings can include a sidewall (or a plurality of sidewalls) that extends substantially perpendicular to the major surface 9 of the substrate 8, and is defined by the physically exposed sidewall surfaces of the alternating stack 30. In one embodiment, the sidewalls of the recessed portions of the substrate semiconductor layer 10 can be vertically coincident with the sidewalls of the memory openings. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

A memory film layer, a semiconductor channel layer, and optionally, a dielectric fill material layer can be sequentially deposited in the memory openings and over the alternating stack 30. The memory film layer can include a stack, from one side to another, of a blocking dielectric layer, a charge storage layer, and a tunnel dielectric layer. Thus, the blocking dielectric layer, the charge storage layer, the tunnel dielectric layer, the semiconductor channel layer, and the optional dielectric fill material layer can be sequentially deposited to fill the memory holes.

The blocking dielectric layer may include one or more dielectric material layers that can function as the dielectric material(s) of a control gate dielectric between the conductive electrodes 34 and charge storage regions to be subsequently formed out of the charge storage layer. The blocking dielectric layer can include silicon oxide, a dielectric metal oxide, a dielectric metal oxynitride, or a combination thereof.

The charge storage layer includes a charge trapping material, which can be, for example, silicon nitride or a conductive material such as doped polysilicon or a metallic material. In one embodiment, the charge storage layer includes silicon nitride. The charge storage layer can be formed as a single charge storage layer of homogeneous composition, or can include a stack of multiple charge storage material layers. The multiple charge storage material layers, if employed, can comprise a plurality of spaced-apart floating gate material layers that contain conductive materials and/or semiconductor materials. Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles.

The tunnel dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitrides, dielectric metal oxides (such as aluminum oxide and hafnium oxide), dielectric metal oxynitrides, dielectric metal silicates, alloys thereof, and/or combinations thereof.

The semiconductor channel layer includes a polycrystalline semiconductor material or an amorphous semiconductor material that can be subsequently annealed at an elevated temperature to form a polycrystalline semiconductor material. Semiconductor materials that can be employed for the semiconductor channel layer include, but are not limited to, silicon, germanium, a silicon-germanium alloy, a silicon-carbon alloy, a silicon-germanium-carbon alloy, a III-V compound semiconductor material, a II-VI compound semiconductor material, an organic semiconductor material, or a combination thereof. The semiconductor channel layer can be formed by a conformal deposition process such as chemical vapor deposition (CVD) or atomic layer deposition (ALD). The thickness of the semiconductor channel layer can be in a range from 3 nm to 30 nm, although lesser and greater thicknesses can also be employed. The semiconductor channel layer can include a doped semiconductor material. The doped semiconductor material can be p-doped or n-doped, i.e., doped with p-type electrical dopants or n-type electrical dopants.

Optionally, the dielectric fill material layer includes a dielectric material such as silicon oxide, organosilicate glass (OSG), a spin-on dielectric material, a low-k dielectric material having a dielectric constant less than 3.0, or a combination thereof. In one embodiment, the dielectric fill material layer includes undoped silicon oxide. The dielectric fill material layer can be deposited, for example, by chemical vapor deposition and/or by spin coating. The amount of the deposited dielectric material for the dielectric fill material layer is selected such that the entire cavity of each memory opening is filled with the deposited dielectric material.

Portions of the blocking dielectric layer, the memory film layer, and the optional dielectric fill material layer can be removed above the top surface of the alternating stack 30, for example, by chemical mechanical planarization (CMP), a recess etch, or a combination thereof. Each remaining portion of the memory film layer within a memory hole constitutes a memory film 22. Each remaining portion of the semiconductor channel layer in a memory opening constitutes a semiconductor channel 24. Each remaining portion of the dielectric fill material layer within a memory hole constitutes a dielectric core 26. An adjoining set of a memory film 22, a semiconductor channel 24, and a dielectric core 26 collectively constitutes a memory string 20, which is a vertical column of memory elements. As used herein, a memory element is a structure capable of storing information for a memory bit (a "0" or "1"). In one embodiment, a section of a memory film 22 and a section of a semiconductor channel 24 within one level in proximity to a control gate electrode located at one level, in conjunction with the control gate electrode, constitutes a memory element or a "memory cell." A vertical stack of memory elements constitutes a memory string 20, which is a memory stack structure. In one embodiment, the array of memory strings 20 can be an array of NAND strings.

Top portions of the dielectric cores 26 can be recessed to form cavities by an etch that is selective to the dielectric material of the topmost insulator layer 32. In one embodiment, the etch can be selective to the semiconductor channels 24. A doped semiconductor material portion is formed within each cavity to form drain regions 58. Each drain region 58 contacts a semiconductor channel 24. The semiconductor channels 24 can be intrinsic or doped. If the semiconductor channels 24 are doped, the source regions (not shown) in the substrate semiconductor layer 10 and the drain regions 58 within the memory openings can have a conductivity type that is the opposite of the conductivity type of the semiconductor channels 24. For example, if the semiconductor channels 24 include a p-doped semiconductor material, the source regions and the drain regions 58 can have n-doped semiconductor materials. If the semiconductor channels 24 include an n-doped semiconductor material, the source regions and the drain regions 58 can have p-doped semiconductor materials. Alternately, the source regions (not shown) in the substrate semiconductor layer 10 and the drain regions 58 within the memory openings can have the same conductivity type as the semiconductor channels 24. In one embodiment, the topmost surface of each drain region 58 can be coplanar with the top surface of the topmost insulator layer 32. The bottommost surface of each drain region 58 can be located above a horizontal plane including the bottommost surface of topmost insulator layer 32.

The first exemplary structure contains a three-dimensional semiconductor device including an array of unit device structures over a substrate 8. Each of the unit device structures can include a memory string 20 and a drain region 58. Each memory string 20 includes a semiconductor channel 24 having at least a portion extending along a vertical direction perpendicular to a top surface of the substrate 8. Each drain region 58 contacts a top end of the semiconductor channel 24. The three-dimensional semiconductor device further comprises an alternating stack 30 of insulator layers 32 and conductive electrodes 34 (which can be control gate electrodes) that laterally surround the plurality of memory strings 20.

In one embodiment, the substrate 8 can comprise a silicon substrate, and the three-dimensional semiconductor device can comprise a monolithic, three-dimensional array of NAND strings that includes a monolithic three-dimensional NAND string located over the silicon substrate. For example, at least one memory cell that is located in a first device level of the three-dimensional array of NAND strings can be located over another memory cell in a second device level of the three-dimensional array of NAND strings. The silicon substrate can contain an integrated circuit comprising a driver circuit for the at least one memory cell.

An overlying metal interconnect structure can be formed over the array of memory strings 20. For example, at least one dielectric material layer can be optionally formed over the top surfaces of the alternating stack 30 and the array of memory strings 20. The at least one dielectric material layer deposited on the top surface of the alternating stack is herein referred to as at least one pillar-level dielectric cap layer (61, 63). Each of the at least one pillar-level dielectric cap layer (61, 63) is a dielectric material layer that is formed at the pillar level. As used herein, a "pillar level" refers to a level including contact pillars that contact the drains 58 of the memory strings 20. As used herein, a "pillar-level" element refers to an element that is formed at the location of the pillar level. The at least one pillar-level dielectric cap layer (61, 63) functions as at least one cap layer that covers the entirety of the alternating stack 30, the array of memory strings 20, and the drain regions 58. Each of the at least one pillar-level dielectric cap layer (61, 63) is a dielectric material layer that is present at the pillar level. Alternatively, the at least one pillar-level dielectric cap layer (61, 63) may be omitted.

In one embodiment, the at least one pillar-level dielectric cap layer (61, 63) can include a first pillar-level dielectric cap layer 61 containing a first dielectric material and a second pillar-level dielectric cap layer 63 containing a second dielectric material. At least one of the first and second dielectric materials can be selected to be an etch stop material during a subsequent process that removes a sacrificial dielectric layer from above the second dielectric material. In one embodiment, the first dielectric material can be silicon oxide or organosilicate glass (OSG), and the second dielectric material can be silicon nitride or nitrogen-doped organosilicate glass. In one embodiment, each of the first and second pillar-level dielectric cap layers (61, 63) can have a thickness in a range from 3 nm to 60 nm, although lesser and greater thicknesses can also be employed.

Subsequently, a pillar-level sacrificial material layer 65 can be formed over the at least one pillar-level dielectric cap layer (61, 63), or, in case the at least one pillar-level dielectric cap layer (61, 63) is not present over the alternating stack 30. The pillar-level sacrificial material layer 65 is a sacrificial dielectric material layer that is formed at the pillar level, and is subsequently removed selective to at least one of the layers in the at least one pillar-level dielectric cap layer (61, 63), e.g., one of the first and second dielectric cap material layers (61, 63). In one embodiment, the pillar-level sacrificial material layer 65 can include a material selected from undoped silicon oxide, doped silicon oxide, an organic polymer material, an inorganic polymer material, a semiconductor material, an organosilicate glass, and porous variants thereof. In one embodiment, the pillar-level sacrificial material layer 65 can include a porous dielectric material layer such as porous hydrogen silsesquioxane, porous alkyl silsesquioxane, a porous spin-on aromatic polymer, porous silicon oxide, xerogel, or aerogel.

The pillar-level sacrificial material layer 65 can be deposited, for example, by spin-coating, chemical vapor deposition (CVD), physical vapor deposition (PVD), or a combination thereof. The thickness of the pillar-level sacrificial material layer 65 can be in a range from 30 nm to 300 nm, although lesser and greater thicknesses can also be employed. Optionally, a sacrificial planarization stop layer (not shown) may be optionally formed over the top surface of the pillar-level sacrificial material layer 65. The sacrificial planarization stop layer can include, for example, silicon oxide, silicon nitride, a nitrogen-doped organosilicate glass, or a sacrificial metallic liner.

A photoresist layer (not shown), and optionally an antireflective coating layer (not shown), can be formed over the top surface of the pillar-level sacrificial material layer 65, and is lithographically patterned to form an array of openings therein. The pattern of the openings can be substantially the same as the pattern of contact pillars to be subsequently formed. FIG. 4 illustrates an exemplary layout between an array of memory strings 20 and an array of contact pillars 68 to be subsequently formed in areas of the openings in the photoresist layer.

Referring back to FIG. 1A, the pattern in the photoresist layer is transferred through the pillar-level sacrificial material layer 65 and the at least one pillar-level dielectric cap layer (61, 63) to form a plurality of pillar cavities 66. As used herein, a "pillar" structure refers to a structure having a pillar shape. As used herein, a "pillar shape" refers to a shape in which all sidewalls do not deviate from a vertical direction by more than 25 degrees. A top surface of a drain region 58 can be physically exposed at the bottom of each pillar cavity 66. In one embodiment, each of the plurality of pillar cavities 66 can have a substantially cylindrical shape or an inverted frustum shape. In one embodiment, the at least one pillar-level dielectric cap layer (61, 63) can include an etch stop layer that is subsequently employed as an etch stop during removal of an overlying sacrificial material layer.

Referring to FIG. 1B, a plurality of contact pillars 68 can be formed within the plurality of pillar cavities 66 by depositing a conductive material within the pillar cavities 66 and over the top surface of the pillar-level sacrificial material layer 65, and subsequently removing the portion of the deposited conductive material from above the top surface of the pillar-level sacrificial material layer 65. The conductive material that fills the plurality of pillar cavities 66 can include a conductive metallic nitride such as titanium nitride, tantalum nitride, tungsten nitride, or a combination thereof, an elemental metal such as W, Al, Cu, Ag, and Au, an intermetallic alloy of at least two elemental metals, a doped semiconductor material such as doped polysilicon, a metal semiconductor alloy such as a metal silicide, and/or a combination thereof. In one embodiment, the conductive material can include a stack of a conductive metallic nitride and an elemental metal or a stack of a conductive metallic nitride and an intermetallic alloy. The conductive material can be deposited, for example, by chemical vapor deposition (CVD), physical vapor deposition (PVD), electroplating, electroless plating, or a combination thereof.

The removal of the conductive material from above the top surface of the pillar-level sacrificial material layer 65 can be performed, for example, by chemical mechanical planarization (CMP), a recess etch, or a combination thereof. If a sacrificial planarization stop layer is present over the pillar-level sacrificial material layer 65, the sacrificial planarization stop layer can be employed as a stopping layer for the planarization process, and subsequently removed selective to the pillar-level sacrificial material layer 65 during a subsequent step of the planarization process or after the planarization process.

The plurality of conductive pillars 68 can be formed through the pillar-level sacrificial material layer 65 and at least one pillar-level dielectric cap layer (61, 63) and directly on the drain regions 58. Each of the plurality of contact pillars 68 can have a horizontal cross-sectional shape that is invariant under translation along the vertical direction. In one embodiment, each of the plurality of contact pillars 68 can have a substantially cylindrical shape. Alternatively, the plurality of contact pillars 68 can have shapes of inverted frustums.

Referring to FIG. 1C, the pillar-level sacrificial material layer 65 can be removed selective to the plurality of contact pillars 68 to form a contiguous space laterally surrounding the plurality of contact pillars 68. The removal of the pillar-level sacrificial material layer 65 can be selective to one of the at least one pillar-level dielectric cap layer (61, 63). In one embodiment, the pillar-level sacrificial material layer 65 can be removed by a dry etch process, which can be a reactive ion etch. The dry etch process may be anisotropic or isotropic. In another embodiment, a wet etch solvent can be employed to remove the pillar-level sacrificial material layer 65. The etch chemistry of the dry etch process or the wet etch solvent can be selected not to etch the plurality of the contact pillars 68 and one or more of the at least one pillar-level dielectric cap layer (61, 63).

In an alternative embodiment, formation of the at least one pillar-level dielectric cap layer (61, 63) and the pillar-level sacrificial material layer 65 can be omitted, and the plurality of contact pillars 68 may be formed by deposition of a conductive material layer directly on the top surfaces of the drain regions 58 and the topmost surfaces of the alternating stack 30, and by subsequent patterning of the conductive material layer. In an optional embodiment, any pillar-level dielectric cap layer (61, 63) and at least an upper portion of the topmost insulator layer 32 can be removed, for example, by a recess etch so that the physically exposed surface of at the end of the processing steps of FIG. 1K include a recessed planar top surface of the topmost insulator layer 32 or a top surface of the topmost conductive electrode 34.

Referring to FIGS. 1D and 1E, an optional dielectric material can be non-conformally deposited over the plurality of contact pillars 68 to form the cover insulating layer 72. The cover insulating layer 72 can be a via-level dielectric layer. As used herein, a "via level" refers to a level including a contact via structure that provides a vertically conductive electrical path, or a level in which such a contact via structure is to be subsequently formed. As used herein, a "via-level" structure is a structure that is present at least partly within the volume of a via level. The non-conformal deposition of the cover insulating layer 72 can be performed employing a directional deposition method in which the deposited material impinges onto the first exemplary structure predominantly along the direction substantially perpendicular to the surface normal to the major surface 9 of the substrate 8, i.e., along the surface normal to the top surface of the substrate 8. Exemplary non-conformal deposition methods include, but are not limited to, plasma enhanced chemical vapor deposition (PECVD), physical vapor deposition (PVD), molecular beam deposition, and vacuum evaporation. The cover insulating layer 72 can be formed partly in the via level and partly in the pillar level.

During the non-conformal deposition, a predominant portion (more than 50%) of the deposited material can impinge downward along directions that do not deviate from a vertical downward direction by more than 45 degrees. In one embodiment, the predominant portion (more than 50%) of the deposited material can impinge downward along directions that do not deviate from a vertical downward direction by more than 30 degrees. In another embodiment, the predominant portion (more than 50%) of the deposited material can impinge downward along directions that do not deviate from a vertical downward direction by more than 15 degrees. Due to the non-conformal nature of the deposition process, the deposited material does not entirely fill the volume among the plurality of contact pillars 68, and forms a contiguous cavity that extends throughout the region of the plurality of the plurality of contact pillars 68 and laterally surround each contact pillar 68.

The non-conformal deposition of the dielectric material causes the volume of the deposited material on the top surfaces of the contact pillars 68 to expand laterally and vertically until discrete portions of the non-conformally deposited dielectric material to merge, and to form a contiguous material layer that overlies the plurality of contact pillars 68 and a pillar-level contiguous cavity 69 without a hole therein. In other words, a contiguous portion of the non-conformally deposited dielectric material that does not contain any opening therein overlies the plurality of contact pillars 68 and the pillar-level contiguous cavity 69.

The portion of the cover insulating layer 72 located above the horizontal plane including the top surfaces of the contact pillars 68 includes a contiguous bottom surface. A first separation distance sd1 of a non-planar bottom surface of the cover insulating layer 72 from the top surface of the at least one pillar-level dielectric cap layer (61, 63), or, from the top surface of the topmost insulator layer 32 if the at least one pillar-level dielectric cap layer (61, 63) is not formed, increases with a lateral distance ld from a most proximal sidewall surface of the plurality of contact pillars 68. A second separation distance sd2 of a non-planar top surface of the cover insulating layer 72 located above a horizontal plane including top surfaces of the plurality of contact pillars 68 decreases with the lateral distance ld from the most proximal sidewall surface of the plurality of contact pillars 68.

During the lateral and vertical expansion of the deposited dielectric material from above the top surfaces of the plurality of contact pillars 68, vertical portions of the non-conformally deposited dielectric material grow non-uniformly on the sidewall surfaces of the plurality of contact pillars 68 and on the topmost surfaces of the at least one pillar-level dielectric cap layer (61, 63). The dielectric material of the cover insulating layer 72 can grow laterally from the sidewalls of the contact pillars 68 with differential lateral growth rates that change with a first vertical distance vd1 from the topmost surface of the at least one pillar-level dielectric cap layer (61, 63). The sidewall surfaces of vertical portions of the cover insulating layer 72 can have a lateral thickness lt that increases with the first vertical distance vd1. Vertical portions of the cover insulating layer 72 vertically extend downward from the contiguous bottom surface, and laterally surround the plurality of contact pillars 68. Each of the vertical portions of the cover insulating layer 72 has a horizontal cross-sectional area that increases with the first vertical distance from the topmost surface of the at least one pillar-level dielectric cap layer (61, 63).

Further, the dielectric material of the cover insulating layer 72 can grow vertically from the topmost surface of the at least one dielectric cap layer 72 with differential vertical growth rates that changes with a lateral distance ld from the most proximal sidewall of the plurality of contact pillars 68. A horizontal portion of the cover insulating layer 72, located directly on the topmost surface of the at least one pillar-level dielectric cap layer (61, 63), can have a vertical thickness vt that increases with the lateral distance ld from the most proximal sidewall of the plurality contact pillars 68. The horizontal portion of the cover insulating layer 72 can have a non-planar top surface that adjoins sidewalls of the portions of the cover insulating layer 72 and a bottom surface that contacts the topmost surface of the at least one pillar-level dielectric cap layer (61, 63).

In one embodiment, a contiguous unfilled volume around the plurality of contact pillars 68 constitutes a contiguous volume of a homogeneous composition. The contiguous volume of the homogeneous composition is herein referred to as a pillar-level contiguous cavity 69. In one embodiment, the homogeneous composition is a composition selected from a gaseous composition and vacuum (e.g., a vacuum cavity or a gas filled cavity (e.g., an air filled cavity (also known as an air gap), or an inert gas filled cavity)). As used herein, vacuum is considered a composition in which no material is present. In case a gas is trapped within the contiguous volume of the homogeneous composition, the gas can have the composition of the residual gas during deposition of the cover insulating layer 72. Alternatively, a different gas (e.g., air) may seep through the cover insulating layer 72 depending on the thickness of the cover insulating layer 72 and duration of passage of time. Yet alternatively, the homogeneous composition can be vacuum. The dielectric constant of the contiguous volume of the homogeneous composition, i.e., of the pillar-level contiguous cavity 69, can be less than 3.9. In one embodiment, the dielectric constant of the contiguous volume of the homogeneous composition can be less than 3.0, and may be less than 1.1. In one embodiment, the dielectric constant of the contiguous volume of the homogeneous composition can be less than 1.01, and can be substantially equal to 1.0.

A pillar-level structure is provided, which includes a plurality of contact pillars 68 and a contiguous volume (which may have a homogeneous composition), as embodied as the pillar-level contiguous cavity 69, that laterally surrounds the plurality of contact pillars 68. The pillar-level structure can optionally include vertical portions of the cover insulating layer 72 that laterally surrounds the plurality of contact pillars 68, and a horizontal portion of the cover insulating layer 72 that contacts the topmost surface of the at least one pillar-level dielectric cap layer (61, 63). Each of the plurality of contact pillars 68 is in contact with a respective one of the drain regions 58. The contiguous volume of the pillar-level contiguous cavity 69 is located above a top surface of at least one dielectric material layer contacting bottom portions of the plurality of contact pillars 68, e.g., on the topmost surface of the at least one pillar-level dielectric cap layer (61, 63) or on the top surface of the alternating stack 30. At least an upper surface of the contiguous volume, i.e., of the pillar-level contiguous cavity 69, includes a contiguous bottom surface of the cover insulating layer 72.

In an optional embodiment, any pillar-level dielectric cap layer (61, 63) and at least an upper portion of the topmost insulator layer 32 can be removed, for example, by a recess etch so that the physically exposed surface of at the end of the processing steps of FIG. 1K include a recessed planar top surface of the topmost insulator layer 32 or a top surface of the topmost conductive electrode 34T (see FIG. 5). In this case, the bottommost surface of the pillar-level contiguous cavity 69 can be located below a horizontal plane including topmost surfaces of drain regions 58 underlying the plurality of contact pillars 68.

Referring to FIG. 1F, a via-level sacrificial material layer 75 can be deposited over the cover insulating layer 72. The via-level sacrificial material layer 75 can include any of the sacrificial dielectric material that can be employed for the pillar-level sacrificial material layer 65. The via-level sacrificial material layer 75 can be deposited, for example, by spin-coating, chemical vapor deposition (CVD), physical vapor deposition (PVD), or a combination thereof. The thickness of the via-level sacrificial material layer 75 can be in a range from 100 nm to 300 nm, although lesser and greater thicknesses can also be employed. Optionally, a sacrificial planarization stop layer (not shown) may be optionally formed over the top surface of the via-level sacrificial material layer 75. The sacrificial planarization stop layer can include, for example, silicon oxide, silicon nitride, a nitrogen-doped organosilicate glass, or a sacrificial metallic liner.

A photoresist layer (not shown), and optionally an anti-reflective coating layer (not shown), can be formed over the top surface of the via-level sacrificial material layer 75, and is lithographically patterned to form an array of openings therein. The pattern of the openings can be substantially the same as the pattern of contact via structures to be subsequently formed. FIG. 4 illustrates an exemplary layout between an array of contact pillars 68 and an array of contact via structures 78 to be subsequently formed in areas of the openings in the photoresist layer.

The contact via structures 78 may be narrower than the underlying contact pillars 68 in order to provide a higher density for the contact via structures 78 at least along one direction, which can be transverse to the lengthwise direction of bit lines 88 that are subsequently formed. In one embodiment, the plurality of contact via structures 78 has a lesser lateral dimension than a maximum lateral dimension of a contact pillar among the plurality of contact pillars 68.

In one embodiment illustrated in FIG. 4, a vertically adjoined pair of a contact via structure 78 and an underlying contact pillar 68 collectively constitutes an electrical contact (68, 78). The overlying contact via structure 78, which is an upper via contact portion, can have a first lateral dimension along a first horizontal direction that is less than a lateral dimension (e.g., the diameter) of the underlying pillar structure 68, which is a lower contact pillar portion, along the first direction. In other words, the width of the contact via structure 78 in the first horizontal direction perpendicular to the bit line 88 direction is smaller than the width (e.g., the diameter) of the underlying pillar structure 68 in the same direction. The overlying contact via structure 78 can have a second lateral dimension along a second horizontal direction parallel to the bit line 88 direction that can be greater than, equal to, or less than a lateral dimension (e.g., the diameter) of the underlying contact pillar 68 along the second direction. In other words, the length of the contact via structure 78 in a direction parallel to the bit line direction can be greater than, equal to, or smaller than, the length (e.g., diameter) of the underlying pillar structure 68 in the same direction.

In one embodiment shown in FIG. 4, the horizontal cross section of the upper via contact structure 78 has a greater eccentricity than the eccentricity of a horizontal cross section of the lower contact pillar structure 68. In this embodiment, a horizontal cross section of the upper via contact portion can be elliptical and have a first eccentricity which is greater than an eccentricity of a horizontal cross section of the lower contact pillar portion, which has another elliptical shape. As used herein, an elliptical shape collectively refers to shapes of ellipses and circles (which have an eccentricity of zero). In other words, the horizontal cross section of lower contact pillar structure 68 may have substantially circular shape (i.e., exactly circular or ellipse with less eccentricity than that of the upper via contact structure 78), while the horizontal cross section of the upper via contact structure 78 may have an ellipsoid shape (i.e., ellipse with an eccentricity of greater than zero), with a bigger dimension in the direction parallel to the bit line 88 direction, and a smaller dimension in the direction perpendicular to the bit line direction. In one embodiment shown in FIG. 4, the bit line half-pitch (i.e., bit line wire width) can be smaller than the memory opening width (e.g., diameter) and lower contact pillar structure 68 width (e.g., diameter). Therefore, the upper via contact structure 78 has a smaller dimension (i.e., size) in the direction perpendicular to the bit line 88 direction in order not to short adjacent bit lines 88 by one the upper via contact structure 78.

Referring back to FIG. 1F, the pattern in the photoresist layer is transferred through the via-level sacrificial material layer 75 and the cover insulating layer 72 to form a plurality of via cavities 76. A top surface of a contact pillar 68 can be physically exposed at the bottom of each via cavity 76. In one embodiment, each of the plurality of via cavities 76 can have a tapered shape (e.g., a shape of an inverted frustum), or can have a substantially cylindrical shape. Alternatively, the plurality of via cavities 76 can have shapes of inverted frustums.

Referring to FIG. 1G, a plurality of contact via structures 78 can be formed within the plurality of via cavities 76. The plurality of contact via structures 78 can be formed on the top surfaces of the plurality of contact pillars 68 and through the cover insulating layer 72 and the via-level sacrificial material layer 75. Each of the plurality of contact via structures 78 contacts a respective one of the plurality of contact pillars 68.

The conductive material that fills the plurality of via cavities 76 can include a conductive metallic nitride such as titanium nitride, tantalum nitride, tungsten nitride, or a combination thereof, an elemental metal such as W, Al, Cu, Ag, and Au, an intermetallic alloy of at least two elemental metals, a doped semiconductor material such as doped polysilicon, a metal semiconductor alloy such as a metal silicide, and/or a combination thereof. In one embodiment, the conductive material can include a stack of a conductive metallic nitride and an elemental metal or a stack of a conductive metallic nitride and an intermetallic alloy. The removal of the conductive material from above the top surface of the via-level sacrificial material layer 75 can be performed, for example, by chemical mechanical planarization (CMP), a recess etch, or a combination thereof. If a sacrificial planarization stop layer is present over the via-level sacrificial material layer 75, the sacrificial planarization stop layer can be employed as a stopping layer for the planarization process, and subsequently removed selective to the via-level sacrificial material layer 75 during a subsequent step of the planarization process or after the planarization process.

Referring to FIG. 1H, the via-level sacrificial material layer 75 can be removed selective to the plurality of contact via structures 78. The removal of the via-level sacrificial material layer 75 can be selective to the cover insulating layer 72. In one embodiment, the via-level sacrificial material layer 75 can be removed by a dry etch process, which can be a reactive ion etch. The dry etch process may be anisotropic or isotropic. In another embodiment, a wet etch solvent can be employed to remove the via-level sacrificial material layer 75. The etch chemistry of the dry etch process or the wet etch solvent can be selected not to etch the plurality of the contact via structures 78 or the cover insulating layer 72.

A dielectric material is non-conformally over the plurality of contact via structures 78 to form a line-level dielectric layer 82. As used herein, a "line level" refers to a level including a conductive line structure that provides a horizontally conductive electrical path, or a level in which such a conductive line structure is to be subsequently formed. As used herein, a "line-level" structure is a structure that is present at least partly within the volume of a line level. The non-conformal deposition of the line-level dielectric layer 82 can be performed employing a directional deposition method in which the deposited material impinges onto the first exemplary structure predominantly along the direction substantially parallel to the surface normal to the major surface 9 of the substrate 8, i.e., along the surface normal to the top surface of the substrate 8. Methods employed for deposition of the cover insulating layer 72 can be employed to form the line-level dielectric layer 82.

The non-conformal deposition of the dielectric material causes the volume of the deposited material on the top surfaces of the contact via structures 78 to expand laterally and vertically until discrete portions of the non-conformally deposited dielectric material to merge, and to form a contiguous material layer that overlies the plurality of contact via structures 78 without a hole therein. In other words, a contiguous portion of the non-conformally deposited dielectric material that does not contain any opening therein overlies the plurality of contact via structures 78.

In one embodiment, a contiguous unfilled volume around the plurality of contact via structures 78 constitutes a contiguous volume (which may have a homogeneous composition), which is herein referred to as a via-level contiguous cavity 79. In one embodiment, the homogeneous composition of the via-level contiguous cavity 79 can be a composition selected from a gaseous composition and vacuum. In case a gas is trapped within the contiguous volume of the homogeneous composition, the gas can have the composition of the residual gas during deposition of the line-level dielectric layer 82. Alternatively, a different gas may seep through the line-level dielectric layer 82 depending on the thickness of the line-level dielectric layer 82 and duration of passage of time. Yet alternatively, the homogeneous composition can be vacuum. The dielectric constant of the contiguous volume of the homogeneous composition, i.e., of the via-level contiguous cavity 79, can be less than 3.9. In one embodiment, the dielectric constant of the via-level contiguous cavity 79 can be less than 3.0, and may be less than 1.1. In one embodiment, the dielectric constant of the contiguous volume of the homogeneous composition can be less than 1.01, and can be substantially equal to 1.0.

Referring to FIG. 1I, a line-level sacrificial material layer 85 can be deposited over the line-level dielectric layer 82. The line-level sacrificial material layer 85 can include any of the sacrificial dielectric material that can be employed for the pillar-level sacrificial material layer 65 or the via-level sacrificial material layer 75. The line-level sacrificial material layer 85 can be deposited, for example, by spin-coating, chemical vapor deposition (CVD), physical vapor deposition (PVD), or a combination thereof. The thickness of the line-level sacrificial material layer 85 can be in a range from 100 nm to 300 nm, although lesser and greater thicknesses can also be employed. Optionally, a sacrificial planarization stop layer (not shown) may be optionally formed over the top surface of the line-level sacrificial material layer 85. The sacrificial planarization stop layer can include, for example, silicon oxide, silicon nitride, a nitrogen-doped organosilicate glass, or a sacrificial metallic liner.

A photoresist layer (not shown), and optionally an antireflective coating layer (not shown), can be formed over the top surface of the line-level sacrificial material layer 85, and is lithographically patterned to form an array of openings therein. The pattern of the openings can be substantially the same as the pattern of bit lines to be subsequently formed. FIG. 4 illustrates an exemplary layout between the array of contact via structures 78 and an array of bit lines 88 to be subsequently formed in areas of the openings in the photoresist layer. Referring back to FIG. 1I, the pattern in the photoresist layer is transferred through the line-level sacrificial material layer 85 and the line-level dielectric layer 82 to form a plurality of line cavities 86. A top surface of a contact via structure 78 can be physically exposed at the bottom of each line cavity 86. In one embodiment, each of the plurality of line cavities 86 can have a substantially rectangular vertical cross-sectional shape.

Referring to FIG. 1J, a plurality of bit lines 88 can be formed within the plurality of line cavities 86. The plurality of bit lines 88 can be formed on the top surfaces of the plurality of contact via structures 78 and through the line-level dielectric layer 82 and the line-level sacrificial material layer 85. Each of the plurality of bit lines 88 contacts a respective one of the plurality of contact via structures 78. The plurality of bit lines 88 is formed on the topmost portions of the plurality of contact via structures 78. The plurality of bit lines 88 laterally extends along a same horizontal direction.

The conductive material that fills the plurality of line cavities 86 can include a conductive metallic nitride such as titanium nitride, tantalum nitride, tungsten nitride, or a combination thereof, an elemental metal such as W, Al, Cu, Ag, and Au, an intermetallic alloy of at least two elemental metals, a doped semiconductor material such as doped polysilicon, a metal semiconductor alloy such as a metal silicide, and/or a combination thereof. In one embodiment, the conductive material can include a stack of a conductive metallic nitride and an elemental metal or a stack of a conductive metallic nitride and an intermetallic alloy. The removal of the conductive material from above the top surface of the line-level sacrificial material layer 85 can be performed, for example, by chemical mechanical planarization (CMP), a recess etch, or a combination thereof. If a sacrificial planarization stop layer is present over the line-level sacrificial material layer 85, the sacrificial planarization stop layer can be employed as a stopping layer for the planarization process, and subsequently removed selective to the line-level sacrificial material layer 85 during a subsequent step of the planarization process or after the planarization process.

Referring to FIG. 1K, the line-level sacrificial material layer 85 can be removed selective to the plurality of bit lines 88. The removal of the line-level sacrificial material layer 85 can be selective to the line-level dielectric layer 82. In one embodiment, the line-level sacrificial material layer 85 can be removed by a dry etch process, which can be a reactive ion etch. The dry etch process may be anisotropic or isotropic. In another embodiment, a wet etch solvent can be employed to remove the line-level sacrificial material layer 85. The etch chemistry of the dry etch process or the wet etch solvent can be selected not to etch the plurality of the contact via structures 78 or the line-level dielectric layer 82.

A dielectric material is non-conformally over the plurality of bit lines 88 to form a capping dielectric layer 92. The non-conformal deposition of the capping dielectric layer 92 can be performed employing a directional deposition method in which the deposited material impinges onto the first exemplary structure predominantly along the direction substantially parallel to the surface normal to the major surface 9 of the substrate 8, i.e., along the surface normal to the top surface of the substrate 8. Methods employed for deposition of the line-level dielectric layer 82 or the cover insulating layer 72 can be employed to form the cap dielectric layer 92.

The non-conformal deposition of the dielectric material causes the volume of the deposited material on the top surfaces of the bit lines 88 to expand laterally and vertically until discrete portions of the non-conformally deposited dielectric material to merge, and to form a contiguous material layer that overlies the plurality of bit lines 88 without a hole therein. In other words, a contiguous portion of the non-conformally deposited dielectric material that does not contain any opening therein overlies the plurality of bit lines 88.

In one embodiment, a contiguous unfilled volume around the plurality of bit lines 88 constitutes a contiguous volume of a homogeneous composition, which is herein referred to as a line-level contiguous cavity 89. In one embodiment, the homogeneous composition of the line-level contiguous cavity 89 is a composition selected from a gaseous composition and vacuum. In case a gas is trapped within the contiguous volume of the homogeneous composition, the gas can have the composition of the residual gas during deposition of the cap dielectric layer 92. Alternatively, a different gas may seep through the cap dielectric layer 92 depending on the thickness of the line-level dielectric layer 82 and duration of passage of time. Yet alternatively, the homogeneous composition can be vacuum. The dielectric constant of the contiguous volume (which may have a homogeneous composition), i.e., of the line-level contiguous cavity 89, can be less than 3.9. In one embodiment, the dielectric constant of the line-level contiguous cavity 89 can be less than 3.0, and may be less than 1.1. In one embodiment, the dielectric constant of the contiguous volume of the homogeneous composition can be less than 1.01, and can be substantially equal to 1.0. In an alternative embodiment, the combination of the plurality of bit lines 88 and the plurality of contact via structures 78 may be formed as integrated line and via structures in the same processing steps including a conductive material deposition process and a planarization process. Yet alternately, the plurality of contact via structures 78 may be omitted and the plurality of bit lines 88 can be formed directly on the plurality of contact pillars 68.

Referring to FIG. 2A, a second exemplary structure according to a second embodiment of the present disclosure can be the same as the first exemplary structure of FIG. 1F.

Referring to FIG. 2B, a conductive material layer 88L can be formed by deposition of a conductive material within the plurality of via cavities 76 and over the top surface of the via-level sacrificial material layer 75. The conductive material that fills the plurality of via cavities 76 can include a conductive metallic nitride such as titanium nitride, tantalum nitride, tungsten nitride, or a combination thereof, an elemental metal such as W, Al, Cu, Ag, and Au, an intermetallic alloy of at least two elemental metals, a doped semiconductor material such as doped polysilicon, a metal semiconductor alloy such as a metal silicide, and/or a combination thereof. In one embodiment, the conductive material can include a stack of a conductive metallic nitride and an elemental metal or a stack of a conductive metallic nitride and an intermetallic alloy. The thickness of the conductive material layer 88 is selected such that the plurality of via cavities are filled with the conductive material and the thickness of the deposited conductive material above the top surface of the via-level sacrificial material layer 75 is sufficient to pattern conductive line structures therefrom. In one embodiment, the thickness of the conductive material layer 88L, as measured above the top surface of the via-level sacrificial material layer 75, can be in a range from 30 nm to 300 nm, although lesser and greater thicknesses can also be employed.

Referring to FIG. 2C, a photoresist layer (not shown), and optionally an antireflective coating layer (not shown), can be formed over the top surface of the conductive material layer 88L, and is lithographically patterned to form an array of linear openings that laterally separate remaining disjoined portions of the photoresist layer. The pattern of the remaining portions of the photoresist layer can be substantially the same as the pattern of bit lines to be subsequently formed. The pattern in the photoresist layer is transferred through the conductive material layer 88L to separate the remaining portions of the conductive material layer 88L into integrated line and via structures 188. Each integrated line and via structure 188 includes at least one contact via structure that fills a via cavity 76 (See FIG. 2A) and a bit line that is located above the top surface of the via-level sacrificial material layer 75 and laterally extending along a horizontal direction. In one embodiment, each of the plurality of bit lines can have a substantially rectangular vertical cross-sectional shape. In one embodiment, the plurality of bit lines in the integrated line and via structures 188 laterally extends along a same horizontal direction.

Referring to FIG. 2D, the via-level sacrificial material layer 75 can be removed selective to the plurality of integrated line and via structures 188. The removal of the via-level sacrificial material layer 75 can be selective to the cover insulating layer 72. In one embodiment, the via-level sacrificial material layer 75 can be removed by a dry etch process, which can be a reactive ion etch. The dry etch process may be anisotropic or isotropic. In another embodiment, a wet etch solvent can be employed to remove the via-level sacrificial material layer 75. The etch chemistry of the dry etch process or the wet etch solvent can be selected not to etch the plurality of the integrated line and via structures 188 or the cover insulating layer 72.

Figure 2E:
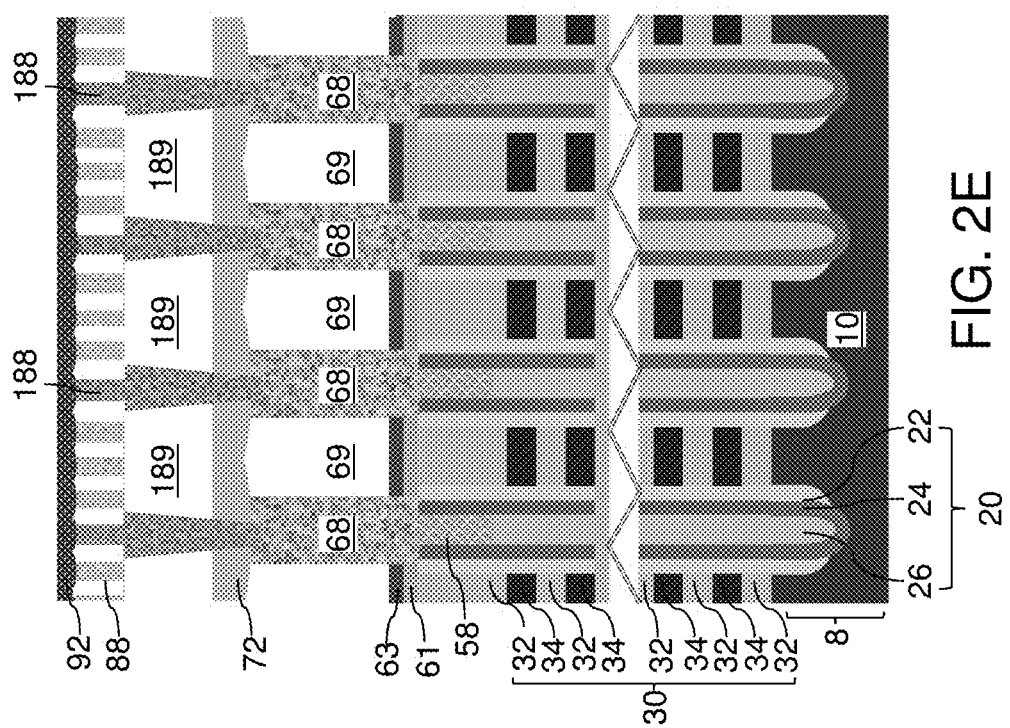

Referring to FIG. 2E, a dielectric material is non-conformally over the plurality of integrated line and via structures 188 to form a capping dielectric layer 92. The non-conformal deposition of the capping dielectric layer 92 can be performed employing a directional deposition method in which the deposited material impinges onto the first exemplary structure predominantly along the direction substantially parallel to the surface normal to the major surface 9 of the substrate 8, i.e., along the surface normal to the top surface of the substrate 8. Methods employed for deposition of the cover insulating layer 72 can be employed to form the cap dielectric layer 92.

The non-conformal deposition of the dielectric material causes the volume of the deposited material on the top surfaces of the integrated line and via structures 188 to expand laterally and vertically until discrete portions of the non-conformally deposited dielectric material to merge, and to form a contiguous material layer that overlies the plurality of line and via structures 188 without a hole therein. In other words, a contiguous portion of the non-conformally deposited dielectric material that does not contain any opening therein overlies the plurality of integrated line and via structures 188.

In one embodiment, a contiguous unfilled volume around the plurality of integrated line and via structures 188 constitutes a contiguous volume (which may have a homogeneous composition), which is herein referred to as a line-and-via-level contiguous cavity 189. In one embodiment, the homogeneous composition of the line-and-via-level contiguous cavity 189 is a composition selected from a gaseous composition and vacuum. In case a gas is trapped within the contiguous volume of the homogeneous composition, the gas can have the composition of the residual gas during deposition of the cap dielectric layer 92. Alternatively, a different gas may seep through the cap dielectric layer 92 depending on the thickness of the line-level dielectric layer 92 and duration of passage of time. Yet alternatively, the homogeneous composition can be vacuum. The dielectric constant of the contiguous volume of the homogeneous composition, i.e., of the line-level contiguous cavity 79, can be less than 3.9. In one embodiment, the dielectric constant of the contiguous volume of the line-level contiguous cavity 79 can be less than 3.0, and may be less than 1.1. In one embodiment, the dielectric constant of the contiguous volume of the homogeneous composition can be less than 1.01, and can be substantially equal to 1.0.

Referring to FIG. 3A, a third exemplary structure according to a third embodiment of the present disclosure can be derived from the first exemplary structure by forming a low dielectric constant (low-k) dielectric material layer in lieu of the pillar-level sacrificial material layer 65. The low-k dielectric material layer formed in lieu of the pillar-level sacrificial material layer 65 is herein referred to as a pillar-level low-k dielectric material layer 64. The pillar-level low-k dielectric material layer 64 can be formed over the at least one pillar level dielectric cap layer (61, 63) or over the alternating stack 30 in case the at least one pillar level dielectric cap layer (61, 63) is not present.

In one embodiment, the low-k dielectric material of the pillar-level low-k dielectric material layer 64 can have a dielectric constant less than 3.0. In one embodiment, low-k dielectric material of the pillar-level low-k dielectric material layer 64 can be a material selected from fluorinated glass, hydrogen silsesquioxane, alkyl silsesquioxane, a spin-on aromatic polymer, polyimide, fluorinated polyimide, doped or undoped parylene, a B-stage polymer, doped or undoped diamond-like carbon, diamond-like carbon, doped or undoped amorphous carbon, polytetrafluoroethylene (PTFE), xerogel, aerogel, and porous variants thereof.

Subsequently, a photoresist layer (not shown), and optionally an antireflective coating layer (not shown), can be formed over the top surface of the pillar-level low-k dielectric material layer 64, and is lithographically patterned to form an array of openings therein. The pattern of the openings can be substantially the same as the pattern of contact pillars to be subsequently formed. FIG. 4 illustrates an exemplary layout between an array of memory strings 20 and an array of contact pillars 68 to be subsequently formed in areas of the openings in the photoresist layer. Referring back to FIG. 3A, the pattern in the photoresist layer is transferred through the pillar-level low-k dielectric material layer 64 and the at least one pillar-level dielectric cap layer (61, 63), if present, to form a plurality of pillar cavities 66.

Referring to FIG. 3B, a plurality of contact pillars 68 can be formed within the plurality of pillar cavities 66 by depositing a conductive material within the pillar cavities 66 and over the top surface of the pillar-level low-k dielectric material layer 64, and subsequently removing the portion of the deposited conductive material from above the top surface of the pillar-level low-k dielectric material layer 64. The same conductive material can be employed to form the plurality of contact pillars 68 as in the first and second embodiments of the present disclosure. Further, the same method can be employed to deposit and planarize the conductive material as in the first and second embodiments of the present disclosure. The plurality of conductive pillars 68 can be formed through the pillar-level low-k dielectric material layer 64 and at least one pillar-level dielectric cap layer (61, 63), if present, and directly on the drain regions 58. Each of the plurality of contact pillars 68 can have a horizontal cross-sectional shape that is invariant under translation along the vertical direction. In one embodiment, each of the plurality of contact pillars 68 can have a substantially cylindrical shape. Alternatively, the plurality of contact pillars 68 can have shapes of inverted frustums.

A pillar-level structure is formed, which includes a plurality of contact pillars 68 and a contiguous volume of a homogeneous composition filled by the pillar-level low-k dielectric material layer 64. The pillar-level low-k dielectric material layer 64 laterally surrounds the plurality of contact pillars 68, which is contact with the drain regions 58. The contiguous volume of the pillar-level low-k dielectric material layer 64 is located above the topmost surface of at least one pillar-level dielectric cap layer (61, 63) contacting bottom portions of the plurality of contact pillars 68. The dielectric constant of the contiguous volume (which may, or may not, have a homogeneous composition), i.e., of the pillar-level low-k dielectric material layer 64, can be less than 3.9. In one embodiment, the dielectric constant of the pillar-level low-k dielectric material layer 64 can be less than 3.0 The contiguous volume of the homogeneous composition can comprise a remaining portion of the pillar-level low-k dielectric material layer 64 after formation of the plurality of pillars 68.

If the pillar-level low-k dielectric material layer 64 includes fluorinated glass, the dielectric constant of the pillar-level low-k dielectric material layer 64 can be about 2.8. If the pillar-level low-k dielectric material layer 64 includes silsesquioxane or alkyl silsesquioxane, the dielectric constant of the pillar-level low-k dielectric material layer 64 can be about 2.7. If the pillar-level low-k dielectric material layer 64 includes a spin-on aromatic polymer, the dielectric constant of the pillar-level low-k dielectric material layer 64 can be about 2.0. If the pillar-level low-k dielectric material layer 64 includes polyimide, the dielectric constant of the pillar-level low-k dielectric material layer 64 can be about 2.9. If the pillar-level low-k dielectric material layer 64 includes fluorinated polyimide, the dielectric constant of the pillar-level low-k dielectric material layer 64 can be about 2.3. If the pillar-level low-k dielectric material layer 64 includes doped or undoped parylene, the dielectric constant of the pillar-level low-k dielectric material layer 64 can be about 2.7. If the pillar-level low-k dielectric material layer 64 includes a B-stage polymer, the dielectric constant of the pillar-level low-k dielectric material layer 64 can be about 2.6. If the pillar-level low-k dielectric material layer 64 includes doped or undoped diamond-like carbon, diamond-like carbon, or doped or undoped amorphous carbon, the dielectric constant of the pillar-level low-k dielectric material layer 64 can be about 2.7. If the pillar-level low-k dielectric material layer 64 includes polytetrafluoroethylene (PTFE), the dielectric constant of the pillar-level low-k dielectric material layer 64 can be about 1.9. If the pillar-level low-k dielectric material layer 64 includes a highly porous dielectric oxide material such as xerogel or aerogel, the dielectric constant of the pillar-level low-k dielectric material layer 64 can be from about 1.8 to about 2.5. Porous version of any non-porous dielectric material generally provides a lower dielectric constant than the non-porous dielectric material.

Referring to FIG. 3C, a via-level dielectric cap layer 73 can be deposited over the top surface of the pillar-level low-k dielectric material layer 64. The via-level dielectric cap layer 73 is a dielectric material layer that is formed in the via level, and can be employed as an etch stop layer during subsequent formation of via cavities. The via-level dielectric cap layer 73 can include silicon oxide, organosilicate glass (OSG), silicon nitride, nitrogen-doped organosilicate glass, or a stack thereof. In one embodiment, the via-level dielectric cap layer 73 can have a thickness in a range from 3 nm to 60 nm, although lesser and greater thicknesses can also be employed. The via-level dielectric cap layer 73 is a cover insulating layer, i.e., a dielectric material layer located in the via level. The contiguous bottom surface of the via-level dielectric cap layer 73 contacts a planar top surface of the pillar-level low-k dielectric material layer 64.

A dielectric material layer can be formed over the via-level dielectric cap layer 73. The dielectric material layer can include a low dielectric constant material having a dielectric constant less than 3.9, which is the dielectric constant of silicon oxide. In this case, the dielectric material layer formed over the via-level dielectric cap layer 73 is herein referred to as a via-level low-k dielectric material layer 74.

The via-level low-k dielectric material layer 74 can have a dielectric constant less than 3.9. In one embodiment, the via-level low-k dielectric material layer 74 can have a dielectric constant less than 3.0. In one embodiment, low-k dielectric material of the via-level low-k dielectric material layer 74 can be selected from any dielectric material that can be employed for the low-k dielectric material of the pillar-level low-k dielectric material layer 64.

A photoresist layer (not shown), and optionally an anti-reflective coating layer (not shown), can be formed over the top surface of the via-level low-k dielectric material layer 74, and is lithographically patterned to form an array of openings therein. The pattern of the openings can be substantially the same as the pattern of contact via structures to be subsequently formed. The pattern in the photoresist layer is transferred through the via-level low-k dielectric material layer 74 and the via-level dielectric cap layer 73 to form a plurality of via cavities 76. A top surface of a contact pillar 68 can be physically exposed at the bottom of each via cavity 76. In one embodiment, each of the plurality of via cavities 76 can have a tapered shape, or can have a substantially cylindrical shape. Alternatively, the plurality of via cavities 76 can have shapes of inverted frustums.

Referring to FIG. 3D, a plurality of contact via structures 78 can be formed within the plurality of via cavities 76. The plurality of contact via structures 78 can be formed on the top surfaces of the plurality of contact pillars 68 and through the via-level low-k dielectric material layer 74 and the via-level dielectric cap layer 73. Each of the plurality of contact via structures 78 contacts a respective one of the plurality of contact pillars 68. The conductive materials that can be employed to form the plurality of contact via structures 78 can be the same as in the first and second embodiments. The deposition and planarization of the conductive material can be performed employing the same processing steps as in the first and second embodiments.

Referring to FIG. 3E, a line-level dielectric cap layer 83 can be deposited over the top surface of the via-level low-k dielectric material layer 64. The line-level dielectric cap layer 83 is a dielectric material layer that is formed in the line level, and can be employed as an etch stop layer during subsequent formation of line cavities. The line-level dielectric cap layer 83 can include silicon oxide, organosilicate glass (OSG), silicon nitride, nitrogen-doped organosilicate glass, or a stack thereof. In one embodiment, the line-level dielectric cap layer 83 can have a thickness in a range from 3 nm to 60 nm, although lesser and greater thicknesses can also be employed. The line-level dielectric cap layer 83 is a line-level dielectric layer, i.e., a dielectric material layer located in the line level. The contiguous bottom surface of the line-level dielectric cap layer 83 contacts can contact a planar top surface of the via-level low-k dielectric material layer 74.

A dielectric material layer can be formed over the line-level dielectric cap layer 83. The dielectric material layer can include a low dielectric constant material having a dielectric constant less than 3.9, which is the dielectric constant of silicon oxide. In this case, the dielectric material layer formed over the line-level dielectric cap layer 83 is herein referred to as a line-level low-k dielectric material layer 84.

The line-level low-k dielectric material layer 84 can have a dielectric constant less than 3.9. In one embodiment, the line-level low-k dielectric material layer 84 can have a dielectric constant less than 3.0. In one embodiment, low-k dielectric material of the line-level low-k dielectric material layer 84 can be selected from any dielectric material that can be employed for the low-k dielectric material of the pillar-level low-k dielectric material layer 64 or the via-level low-k dielectric material layer 74.

A photoresist layer (not shown), and optionally an anti-reflective coating layer (not shown), can be formed over the top surface of the line-level low-k dielectric material layer 84, and is lithographically patterned to form an array of openings therein. The pattern of the openings can be substantially the same as the pattern of bit lines to be subsequently formed. FIG. 4 illustrates an exemplary layout between the array of contact via structures 78 and an array of bit lines 88 to be subsequently formed in areas of the openings in the photoresist layer. Referring back to FIG. 3E, the pattern in the photoresist layer is transferred through the line-level low-k dielectric material layer 84 and the line-level dielectric cap layer 83 to form a plurality of line cavities 86. A top surface of a contact via structure 78 can be physically exposed at the bottom of each line cavity 86. In one embodiment, each of the plurality of line cavities 86 can have a substantially rectangular vertical cross-sectional shape.

Referring to FIG. 3F, a plurality of bit lines 88 can be formed within the plurality of line cavities 86. The plurality of bit lines 88 can be formed on the top surfaces of the plurality of contact via structures 78 and through the line-level low-k dielectric material layer 84 and the line-level dielectric cap layer 83. Each of the plurality of bit lines 88 contacts a respective one of the plurality of contact via structures 78. The plurality of bit lines 88 is formed on the topmost portions of the plurality of contact via structures 78. The plurality of bit lines 88 laterally extends along a same horizontal direction. The conductive material that fills the plurality of line cavities 86 can be the same as in the first embodiment.

Referring to FIG. 3F, a dielectric material can be conformally or non-conformally deposited over the plurality of bit lines 88 to form a capping dielectric layer 93. The capping dielectric layer 93 can include any of the dielectric material that can be employed for the at least one pillar-level dielectric cap layer (61, 63), the via-level dielectric cap layer 73, or the line-level dielectric cap layer 83. Methods employed for deposition of the at least one pillar-level dielectric cap layer (61, 63), the via-level dielectric cap layer 73, or the line-level dielectric cap layer 83 can be employed to form the capping dielectric layer 93. Alternatively, integrated line and via structures 188 can be formed in lieu of each combination of a bit line 88 and at least one contact via structure 78 contacting the bit line 88.

Referring to FIG. 5, a bird's eye view of a cut-out portion of an exemplary structure is shown, which can be any of the first, second, and third exemplary structures. The cavities (69, 79, 89, 189) and the various dielectric material layers between the at least one pillar-level dielectric cap layer (61, 63) (or the alternating stack (32. 34) in case the at least one pillar-level dielectric cap layer (61, 63) is not present) and the capping dielectric layer (92 or 93) are not shown for clarity. Optionally, a passivation dielectric layer 95 can be formed above the capping dielectric layer (92 or 93).

The structures of the various embodiments of the present disclosure can provide low parasitic capacitance between the bit lines 88 (or the integrated line and via structures 188) and the plurality of contact pillars 68 due to the presence of the contiguous volume of a homogeneous composition that laterally surrounds the plurality of contact pillars 68 within a pillar-level structure. The reduction in the parasitic capacitance can reduce the RC delay of the bit lines 88 (or the integrated line and via structures 188), and increase the speed of operation of the device structure, which can include an array of vertical memory stacks, which can be, for example, a monolithic, three-dimensional array of NAND strings.

It will be understood that derivative structures including a contiguous cavity at one level and a low-k dielectric material layer at another level can be formed based on the present disclosure. For example, a pillar-level contiguous cavity 68 can be formed at the pillar level, and at least one low-k dielectric material layer can be formed at the via level. Alternatively, at least one low-k dielectric material layer can be present at the pillar level, and a via level contiguous cavity can be present at the via level 79.

Further, at least one dielectric material layer that is not subsequently removed may be formed in lieu of a via-level sacrificial material layer 75 and/or in lieu of a line-level sacrificial material layer 85. In addition, the contact via structures 78 may be omitted and the bit lines 88 can be formed directly on the pillars 68.

The embodiments described above can be combined to include an air gap or a low-k dielectric material associated with any one or more of contact pillars 68, contact vias 78, and/or bit lines. Thus, the embodiments include any combination of an air gap or a low-k dielectric material for any given level. One embodiment includes an air gap or a low-k dielectric material surrounding contact pillars 68 and contact vias 78, and located in between bit lines 88. Another embodiment includes an air gap or a low-k dielectric material surrounding contact pillars 68 and contact vias 78, and located in between bit lines 88. Another embodiment includes an air gap or a low-k dielectric material only surrounding contact pillars 68, and contact vias 78, but not located in between bit lines 88. Another embodiment includes an air gap or a low-k dielectric material surrounding contact pillars 68 and located in between bit lines 88, but not surrounding contact vias 78. Another embodiment includes an air gap or a low-k dielectric material surrounding contact vias 78, and located in between bit lines 88 but not surrounding contact pillars 68. Another embodiment includes an air gap or a low-k dielectric material only surrounding contact pillars 68. Another embodiment includes an air gap or a low-k dielectric material only surrounding contact vias 78.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three dimensional NAND string, comprising:
   a plurality of semiconductor channels, at least one end portion of each semiconductor channel extending substantially perpendicular to a top surface of a substrate;

a plurality of drain regions, wherein each drain region contacts a top end of a respective one of the plurality of semiconductor channels;

a plurality of control gate electrodes extending substantially parallel to a top surface of a substrate, wherein the plurality of control gate electrodes comprises at least a first control gate electrode located in a first device level and a second control gate electrode located in a second device level located over the major surface of the substrate and below the first device level;

a plurality of interlevel insulator layers located between the plurality of control gate electrodes, such that a first interlevel insulator layer is located between the first control gate electrode and the second control gate electrode;

a blocking dielectric located in contact with the plurality of control gate electrodes;

at least one charge storage region located in contact with the blocking dielectric;

a tunnel dielectric located between the at least one charge storage region and the semiconductor channel;

a plurality of bit lines; and a plurality of electrical contacts, wherein each physically contacts a top surface of a respective one of the plurality of drain regions and is electrically connected to a respective one of the plurality of bit lines;

wherein a cavity or a low-k dielectric layer having a dielectric constant below 3.9 is located among the plurality of electrical contacts and above a horizontal plane including the top surfaces of the drain regions;

wherein: each of the plurality of electrical contacts comprises a lower contact pillar portion which contacts the respective one of the plurality of drain regions and an upper via contact portion which contacts a respective one of the plurality of bit lines; and the lower contact pillar portion has a larger width or diameter than the upper via contact portion; and wherein the cavity which comprises an air gap is located between the plurality of electrical contacts.

2. The NAND string of claim 1, wherein the lower contact pillar portion comprises a cylindrical or inverted frustum shaped pillar, and the upper via contact portion comprises a cylindrical or inverted truncated cone shaped pillar which has a smaller average diameter than the contact pillar.

3. The NAND string of claim 1, wherein the upper via contact portion has a first lateral dimension along a first horizontal direction that is parallel to an overlying bit line, and has a second lateral dimension along a second horizontal direction that that is perpendicular to the overlying bit line, the first lateral dimension being greater than the second lateral dimension.

4. The NAND string of claim 1, wherein a horizontal cross section of the upper via contact portion has a first eccentricity which is greater than an eccentricity of a horizontal cross section of the lower contact pillar portion.

5. The NAND string of claim 1, wherein the low-k dielectric layer having a dielectric constant below 3.9 is located between the plurality of electrical contacts.

6. The NAND string of claim 1, wherein each of the plurality of electrical contacts has a substantially cylindrical shape or an inverted frustum shape.

* * * * *